(12) United States Patent
Kusahara et al.

(10) Patent No.: US 8,890,525 B2
(45) Date of Patent: Nov. 18, 2014

(54) MAGNETIC RESONANCE IMAGING APPARATUS AND MAGNETIC RESONANCE IMAGING METHOD

(75) Inventors: Hiroshi Kusahara, Kyoto (JP); Yoshimori Kassai, Nasushiobara (JP); Yutaka Machii, Nasushiobara (JP)

(73) Assignees: Kabushiki Kaisha Toshiba, Minato-Ku, Tokyo (JP); Toshiba Medical Systems Corporation, Otawara-Shi, Toshigi-Ken (JP)

( * ) Notice: Subject to any disclaimer, the term of this patent is extended or adjusted under 35 U.S.C. 154(b) by 427 days.

(21) Appl. No.: 13/320,766

(22) PCT Filed: Aug. 2, 2011

(86) PCT No.: PCT/JP2011/068014
§ 371 (c)(1),
(2), (4) Date: Nov. 16, 2011

(87) PCT Pub. No.: WO2012/020720
PCT Pub. Date: Feb. 16, 2012

(65) Prior Publication Data
US 2012/0146640 A1 Jun. 14, 2012

(30) Foreign Application Priority Data
Aug. 11, 2010 (JP) ................................. 2010-180389

(51) Int. Cl.
*G01V 3/00* (2006.01)
*G01R 33/561* (2006.01)
*G01R 33/565* (2006.01)

(52) U.S. Cl.
CPC ...... *G01R 33/5616* (2013.01); *G01R 33/56554* (2013.01)
USPC ....................................................... 324/309

(58) Field of Classification Search
USPC ................................................. 324/300–322
See application file for complete search history.

(56) References Cited

U.S. PATENT DOCUMENTS

| 4,885,542 | A | * | 12/1989 | Yao et al. | 324/313 |
| 4,937,526 | A | * | 6/1990 | Ehman et al. | 324/309 |
| 5,270,654 | A | * | 12/1993 | Feinberg et al. | 324/309 |

(Continued)

FOREIGN PATENT DOCUMENTS

| JP | 5-64633 | 3/1993 |
| JP | 9-253070 | 9/1997 |

(Continued)

OTHER PUBLICATIONS

International Search Report for PCT/JP2011/068014, mailed Nov. 1, 2011.

(Continued)

*Primary Examiner* — Dixomara Vargas
(74) *Attorney, Agent, or Firm* — Nixon & Vanderhye PC

(57) ABSTRACT

An MRI apparatus produces a plurality of echo signals by performing an EPI echo signal acquisition sequence including gradient magnetic fields in a phase encoding direction, and acquires a plurality of echo signals as first and second template data, respectively. The second template data is acquired using a sequence in which start timing of a gradient magnetic field in a readout direction is shifted from the case where acquisition of the first template data is performed. The phase error included in the echo signals is corrected by using the first and second template data.

18 Claims, 15 Drawing Sheets

(56) References Cited

U.S. PATENT DOCUMENTS

| | | | |
|---|---|---|---|
| 5,672,969 A * | 9/1997 | Zhou et al. | 324/309 |
| RE35,656 E * | 11/1997 | Feinberg et al. | 324/309 |
| 5,942,897 A * | 8/1999 | Kanazawa | 324/309 |
| 6,160,397 A * | 12/2000 | Washburn et al. | 324/309 |
| 6,249,595 B1 * | 6/2001 | Foxall et al. | 382/128 |
| 6,700,374 B1 * | 3/2004 | Wu et al. | 324/312 |
| 7,098,662 B2 * | 8/2006 | Hinks et al. | 324/318 |
| 7,102,352 B2 * | 9/2006 | Hinks et al. | 324/318 |
| 7,259,557 B2 * | 8/2007 | Hinks et al. | 324/309 |
| 7,358,728 B2 * | 4/2008 | Nozaki et al. | 324/307 |
| 7,420,370 B2 * | 9/2008 | Hinks et al. | 324/309 |
| 7,622,924 B2 * | 11/2009 | Hwang | 324/309 |
| 7,656,156 B2 * | 2/2010 | Nozaki et al. | 324/309 |

FOREIGN PATENT DOCUMENTS

| | | |
|---|---|---|
| JP | 9-276243 | 10/1997 |
| JP | 11-290289 | 10/1999 |
| JP | 2001-238866 | 9/2001 |
| JP | 2005-319074 | 11/2005 |
| JP | 2006-255046 | 9/2006 |
| JP | 2007-159718 | 6/2007 |

OTHER PUBLICATIONS

English translation of International Preliminary Report on Patentability in PCT/JP2011/068014 issued Mar. 12, 2013.

* cited by examiner

MAGNETIC RESONANCE IMAGING APPARATUS AND MAGNETIC RESONANCE IMAGING METHOD

This application is the U.S. national phase of International Application No. PCT/JP2011/068014 filed 2 Aug. 2011 which designated the U.S. and claims priority to JP Patent Application No. 2010-180389 filed 11 Aug. 2010, the entire contents of each of which are hereby incorporated by reference.

TECHNICAL FIELD

Example embodiments of the present invention relate to a magnetic resonance imaging apparatus and a magnetic resonance imaging (MRI) method.

BACKGROUND

MRI is an imaging method which magnetically excites nuclear spins of an object set in a static magnetic field with an RF pulse having the Larmor frequency and reconstructs an image based on MR signals generated due to the excitation.

The aforementioned MRI means magnetic resonance imaging, the RF pulse means a radio frequency pulse, and the MR signal means a nuclear magnetic resonance signal.

In MRI, EPI (Echo Planar Imaging) is known as an imaging method. EPI is a high speed imaging method that involves consecutively inverting a gradient magnetic field at high speed for each nuclear magnetic excitation to cause consecutive echoes, thereby acquiring MR signals.

More specifically, according to EPI, all the data required for image reconstruction are acquired by generating consecutive gradient echoes by phase encode steps after applying an excitation pulse and before the magnetization in the xy plane attenuates and disappears because of transverse relaxation (T2 relaxation).

EPI can be sorted into SE EPI, which is based on a spin echo (SE) method and acquires a spin echo signal that occurs following an excitation pulse and a refocusing pulse, FE EPI, which is based on a field echo (FE) method and acquires an echo signal that occurs following an excitation pulse, and an FFE EPI, which is based on a fast FE method.

A type of EPI that generates image data on one image by combining data on an echo train obtained by applying a plurality of excitation pulses is referred to as multi-shot EPI, whereas a type of EPI that reconstructs an image by one application of one excitation pulse is referred to as single-shot EPI.

An EPI sequence involves high speed inversions of the gradient magnetic field during imaging, and therefore, the acquired echo data contains a phase error. As a result, the image reconstructed based on the echo data is distorted. There are two possible primary causes of the phase error: one is the non-uniformity of the static magnetic field, and the other is the eddy magnetic field caused by the switching of the gradient magnetic field (see Non-Patent Documents 1 and 2, for example).

The phase error caused by the non-uniformity of the static magnetic field described above varies depending on the signal intensity distribution of the imaging target and the spatial distribution of the non-uniformity of the static magnetic field in the imaging region. On the other hand, the phase error caused by the eddy magnetic field described above primarily has a first-order gradient in the readout direction in the real space and inverts the direction of the phase gradient depending on the polarity of the gradient magnetic field in the readout direction during acquisition of echo data.

A conventional technique of reducing the phase error caused by the non-uniformity of the static magnetic field is the method of correcting the non-uniformity of the static magnetic field described in Patent Document 1.

A known method of reducing the phase error due to the causes other than the non-uniformity of the static magnetic field is the technique described in Patent Document 2.

Specifically, according to Patent Document 2, two template shots A and B in which the polarities of the gradient magnetic fields in the readout direction are opposite are performed to acquire echo data before the main imaging. The pair of echo data, acquired by the template shots A and B are the same in echo time and therefore in phase error caused by the non-uniformity of the static magnetic field. Based on this, the phase error component caused by the non-uniformity of the static magnetic field is removed. In this way, the phase error component due to the causes other than the non-uniformity of the static magnetic field is selectively extracted and used as phase correction data.

Patent Document 1 referred to above is Japanese Patent Application Laid-open (KOKAI) Publication No. 2006-255046.

Patent Document 2 referred to above is Japanese Patent Application Laid-open (KOKAI) Publication No. 09-276243.

Nonpatent Document 1 referred to above is Self-Correcting EPI Reconstruction Algorithm; A. Jesmanowicz. et. al.; Proceedings of SMR, No. 619, 1995.

Nonpatent Document 2 referred to above is Phase Correction for EPI Using Internal Reference Line; A. Jesmanowicz. et. al.; Proceedings of SMR, No. 1239, 1995.

As described above, there are various methods of correcting the phase error component in the echo data caused by the non-uniformity of the static magnetic field and the phase error component due to the other causes. And the conventional EPI techniques can provide practically satisfactory images. However, the image distortion caused by the phase error is preferably to be made as small as possible.

A task to be solved by the present exemplary embodiments is to provide a technique different from prior arts for further reducing an image distortion caused by a phase error in EPI.

In one embodiment, an MRI Apparatus is capable of performing EPI that includes transmitting an excitation pulse to cause a nuclear magnetic resonance in an object in a static magnetic field, acquiring a plurality of echo signals generated by repeatedly inverting a polarity of a gradient magnetic field in a readout direction, and reconstructing image data on the object based on the plurality of echo signals. This MRI apparatus includes a first acquisition unit, a second acquisition unit and a correction unit.

The first acquisition unit acquires, as first template data, the plurality of echo signals generated by performing an echo signal acquisition sequence of EPI including application of a gradient magnetic field in a phase encoding direction.

The second acquisition unit acquires, as second template data, the plurality of echo signals generated by performing an echo signal acquisition sequence of EPI including application of a gradient magnetic field in the phase encoding direction after acquisition of the first template data, so that start timing of application of the gradient magnetic field in the readout direction in acquisition of the second template data is shifted from start timing of application of the gradient magnetic field in the readout direction in acquisition of the first template data.

The correction unit performs at least correction of phase error in the echo signals by using the first template data and the second template data.

According to the MRI apparatus having the aforementioned configuration, an image distortion caused by a phase error in EPI can be further reduced by a technique different from prior arts.

According to one embodiment, a magnetic resonance imaging method contains EPI and includes the following steps.

One of the steps is acquiring, as first template data, the plurality of echo signals generated by performing an echo signal acquisition sequence of EPI including application of a gradient magnetic field in a phase encoding direction.

Another of the steps is acquiring, as second template data, the plurality of echo signals generated by performing an echo signal acquisition sequence of EPI including application of a gradient magnetic field in the phase encoding direction after acquisition of the first template data, so that start timing of application of the gradient magnetic field in the readout direction in acquisition of the second template data is shifted from start timing of application of the gradient magnetic field in the readout direction in acquisition of the first template data.

Another of the steps is performing at least correction of phase error in the echo signals by using the first template data and the second template data.

According to the MRI method having the aforementioned configuration, an image distortion caused by a phase error in EPI can be further reduced by a technique different from prior arts.

DETAILED DESCRIPTION OF EXEMPLARY EMBODIMENTS

Embodiments of an MRI apparatus and an MRI method will be described with reference to the accompanying drawings.

Note that the same reference numbers are given for identical components in each figure, and overlapping explanation is abbreviated.

(First Embodiment)

Figure 1:
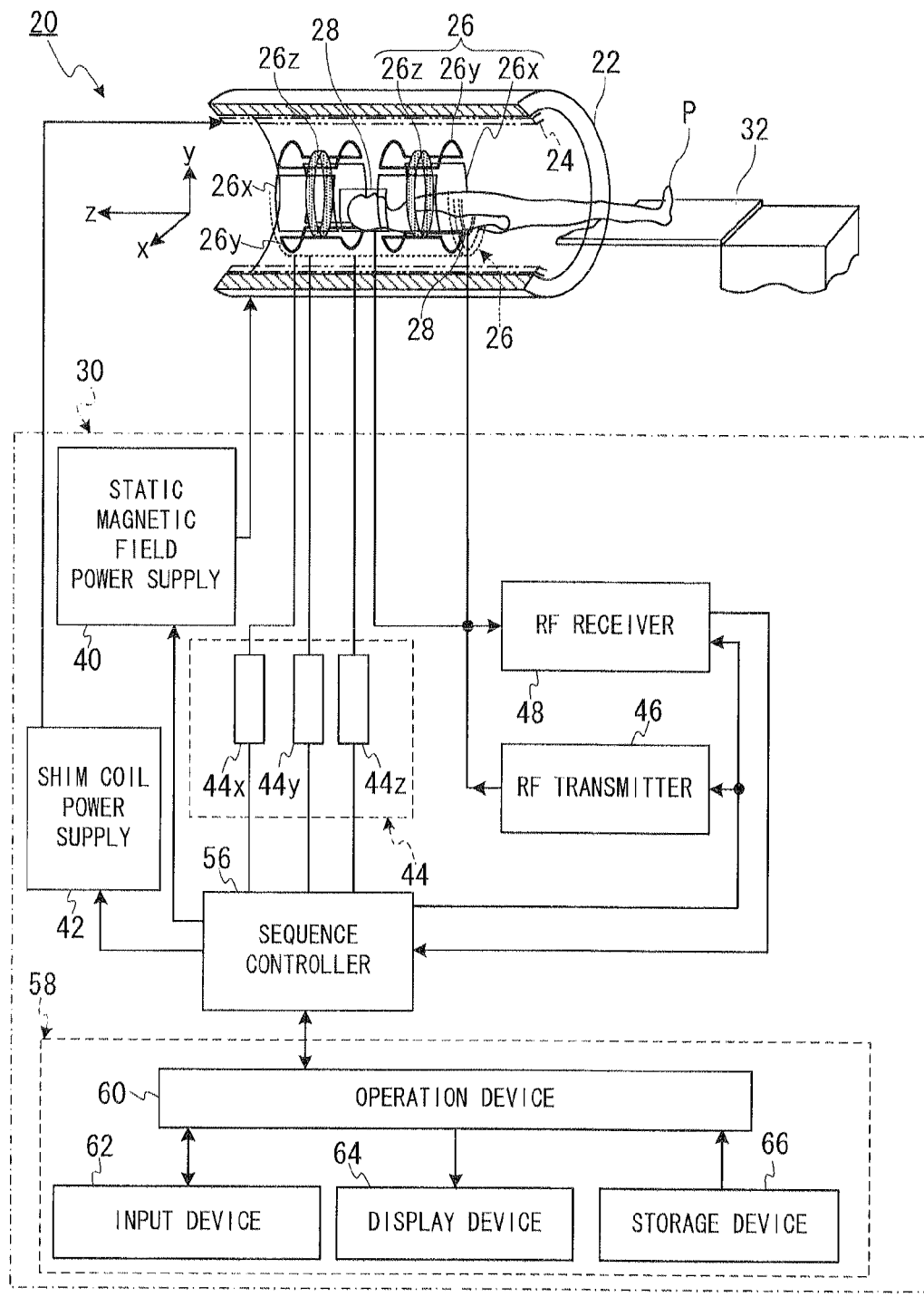
FIG. 1 is a block diagram showing general structure of the MRI apparatus according to one embodiment.

FIG. 1 is a block diagram showing general structure of the MRI apparatus 20 according to the first embodiment.

As shown in FIG. 1, the MRI apparatus 20 includes a cylinder-shaped static magnetic field magnet 22 for generating a static magnetic field, a cylinder-shaped shim coil 24 coaxially-arranged inside the static magnetic field magnet 22, a gradient coil (gradient magnetic field coil) 26, RF coils 28, a control device 30, and a bed 32 for placing an object P on it.

Here, as one example, an apparatus coordinate system, whose X axis, a Y axis and a Z axis are perpendicular to each other, is defined as follows.

Firstly, the direction of an axis of the static magnetic field magnet 22 and the shim coil 24 is aligned with the direction which is perpendicular to the vertical direction, and the direction of the axis of the static magnetic field magnet 22 and the shim coil 24 is defined as the Z axis direction.

Additionally, it is assumed that the vertical direction is the same as the Y axis direction.

Moreover, the bed 32 is disposed in such a position that the direction of "the normal line of the table plane thereof on which an object is put" is the same as the Y axis direction.

The control device 30 includes a static magnetic field power supply 40, a shim coil power supply 42, a gradient magnetic field power supply 44, an RF transmitter 46, an RF receiver 48, a sequence controller 56 and a computer 58.

The gradient magnetic field power supply 44 includes an X-axis gradient magnetic field power supply 44$x$, a Y-axis gradient magnetic field power supply 44$y$ and a Z-axis gradient magnetic field power supply 44$z$.

The computer 58 includes an operation device 60, an input device 62, a display device 64 and a storage device 66.

The static magnetic field magnet 22 is electrically connected to the static magnetic field power supply 40 and generates a static magnetic field in an imaging space by using electric current supplied from the static magnetic field power supply 40.

The aforementioned "imaging space" means, for example, a space in a gantry in which an object P is placed and to which a static magnetic field is applied. The "gantry" refers to a structure having a cylindrical shape, for example, which includes a static magnetic field magnet 22, a shim coil 24, a gradient coil 26, and RF coils 28. The gantry and a bed 32 are configured so that the bed 32 on which the object P is placed can move to the inside of the gantry. For simplicity, FIG. 1 does not show the gantry itself, but shows the static magnetic field magnet 22, the shim coil 24, the gradient coil 26 and the RF coils 28 in the gantry as components of the gantry.

The "imaging region" means, for example, a region set as a part of the imaging space and is a range of acquisition of MR signals used to generate "one image" or "one set of image". The "one image" or "one set of image" may be a two-dimensional image or a three-dimensional image. Here, "one set of images" means, for example, a plurality of images when MR signals of the plurality of images are acquired in a lump in one pulse sequence such as multi-slice imaging. The imaging region is defined three-dimensionally in an apparatus coordinate system, for example. In this specification, as an example, the imaging region will be referred to as "a slice" if the imaging region is a thin region or as "a slab" if the imaging region has a certain thickness.

The shim coil 24 is electrically connected to the shim coil power supply 42 and uniforms the static magnetic field with the electric current supplied from the shim coil power supply 42.

The static magnetic field magnet 22 includes a superconductivity coil in many cases. The static magnetic field magnet 22 gets electric current from the static magnetic field power supply 40 at excitation. However, once excitation has been made, the static magnetic field magnet 22 is usually isolated from the static magnetic field power supply 40. The static magnetic field magnet 22 may include a permanent magnet which makes the static magnetic field power supply 40 unnecessary.

The gradient coil 26 includes an X-axis gradient coil 26x, a Y-axis gradient coil 26y and a Z-axis gradient coil 26z. Each of the X-axis gradient coil 26x, the Y-axis gradient coil 26y and the Z-axis gradient coil 26z is cylinder-shaped and arranged inside the static magnetic field magnet 22.

The X-axis gradient coil 26x, the Y-axis gradient coil 26y and the Z-axis gradient coil 26z are electrically connected to the X-axis gradient magnetic field power supply 44x, the Y-axis gradient magnetic field power supply 44y and the Z-axis gradient magnetic field power supply 44z of the gradient magnetic field power supply 44 respectively.

The X-axis gradient magnetic field power supply 44x, the Y-axis gradient magnetic field power supply 44y and the Z-axis gradient magnetic field power supply 44z supply electric current to the X-axis gradient coil 26x, the Y-axis gradient coil 26y and the Z-axis gradient coil 26z respectively so as to generate a gradient magnetic field Gx in the X-axis direction, a gradient magnetic field Gy in the Y-axis direction and a gradient magnetic field Gz in the Z-axis direction in the imaging region.

That is, directions of a gradient magnetic field Gss in a slice selection direction, a gradient magnetic field Gpe in a phase encoding direction and a gradient magnetic field Gro in a readout (frequency encoding) direction can be arbitrarily set as logical axes, by combining gradient magnetic fields Gx, Gy and Gz in the X-axis, Y-axis and Z-axis directions as three physical axes. The gradient magnetic fields Gss, Gpe and Gra in the slice selection direction, the phase encoding direction and the readout direction are superimposed on the static magnetic field.

The RF transmitter 46 generates RF pulses in accordance with control information provided from the sequence controller 56, and outputs the generated RF pulses (RF current pulses) to the transmission RF coil 28.

The RF coils 28 include a whole body coil built in the gantry for transmission and reception of RF pulses and local coils arranged around the bed 32 or the object P for reception of RE pulses.

The transmission RF coil 28 transmits an RE pulse given from the RF transmitter 46 to the object P. The reception RF coil 28 receives an MR signal generated due to excited nuclear spin inside the object P by the RF pulse and this MR signal is detected by the RF receiver 48.

The RF receiver 48 generates raw data which are digitized complex number data obtained by performing A/D (analogue to digital) conversion after performing predetermined signal processing such as preamplification, intermediate-frequency conversion, phase detection, low-frequency amplification and filtering to the detected MR signal. The RF receiver 48 inputs the generated raw data to the sequence controller 56.

The operation device 60 performs system control of the MRI apparatus 20.

The sequence controller 56 storages control information needed in order to make the gradient magnetic field power supply 44, the RF transmitter 46 and the RF receiver 48 drive. The aforementioned control information includes, for example, sequence information describing operation control information such as intensity, impression period and impression timing of the pulse electric current which should be impressed to the gradient magnetic field power supply 44.

The sequence controller 56 generates the gradient magnetic fields Gx, Gy and Gz in the X-axis, Y-axis and Z-axis directions and RP pulses by driving the gradient magnetic field power supply 44, the RP transmitter 46 and the RF receiver 48 according to a predetermined sequence stored. Additionally, the sequence controller 56 receives raw data of an MR signal inputted from the RF receiver 48, and input the raw data to the operation device 60.

Figure 2:
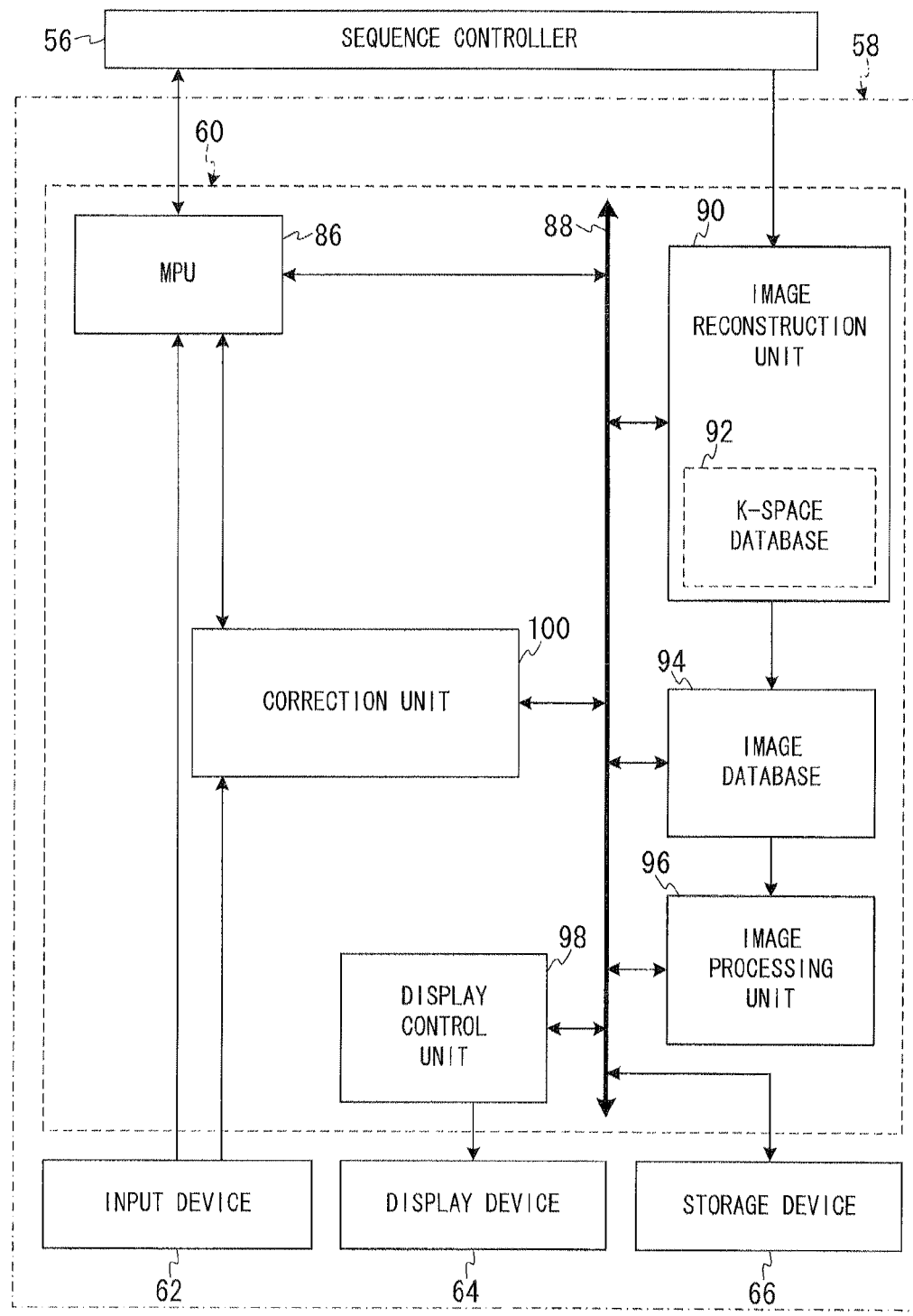
FIG. 2 is a functional block diagram of the computer 58 shown in FIG. 1.

FIG. 2 is a functional block diagram of the computer 58 shown in FIG. 1.

The operation device 60 of the computer 58 includes an MPU (Micro Processor Unit) 86, a system bus 88, an image reconstruction unit 90, an image database 94, an image processing unit 96, an display controlling unit 98, and a correction unit 100.

The MPU 86 performs system control of the MRI apparatus 20 in setting of imaging conditions, imaging operation and image display after imaging through interconnection such as the system bus 88.

The term "imaging condition" refers to under what condition an RF signal or the like is transmitted in what type of pulse sequence, such as of spin echo or EPI, or under what condition an MR signal is acquired from an object, for example.

As a parameter of the "imaging conditions", for example, there are "the imaging region as positional information in the imaging space", a flip angle, a repetition time (TR), the number of slices, the number of steps in the phase encoding direction and the frequency encoding direction, and the type of the pulse sequence such as EPI and spin echo.

Additionally, the MPU 86 functions as imaging conditions setting unit, sets imaging conditions including a pulse sequence based on command information from the input device 62, and inputs the set imaging conditions into the sequence controller 56. In order to achieve it, the MPU 86 controls the display controlling unit 98 and displays screen information for setting imaging conditions on the display device 64.

The input device 62 provides a user with a function to set imaging conditions and image processing conditions.

The image reconstruction unit 90 includes a k-space database 92 inside. The image reconstruction unit 90 arranges raw data of MR signals inputted from the sequence controller 56 in the k-space formed in the k-space database 92 as k-space data. The image reconstruction unit 90 generates image data of each slice of the object P by performing image reconstruction processing. The image reconstruction unit 90 stores the generated image data in the image database 94.

The image processing unit 96 takes in the image data from the image database 94, performs predetermined image processing on them, and stores the image data after the image processing in the storage device 66 as image data for display.

The storage device 66 stores the image data for display after adding "accompanying information such as imaging conditions used for generating the image data for display and information of the object P (patient information)" to the image data for display.

The display controlling unit 98 displays a screen for setting imaging conditions and an image indicated by generated image data through imaging on the display device 64 under control of the MPU 86.

A correction unit 100 performs the following two operations based on data acquired by template shots 1 and 2 performed as a prescan before acquisition of an MR signal of a desired image (main scan).

Firstly, the correction unit 100 generates a magnetic field correction map for correcting a non-uniformity of a static magnetic field (for uniformizing a static magnetic field).

Secondly, the correction unit 100 generates phase correction data used for removing an effect of a phase error in the MR signals acquired in the main scan in reconstruction of image data from the MR signals. In the following, these operations will be described in detail.

Figure 3:
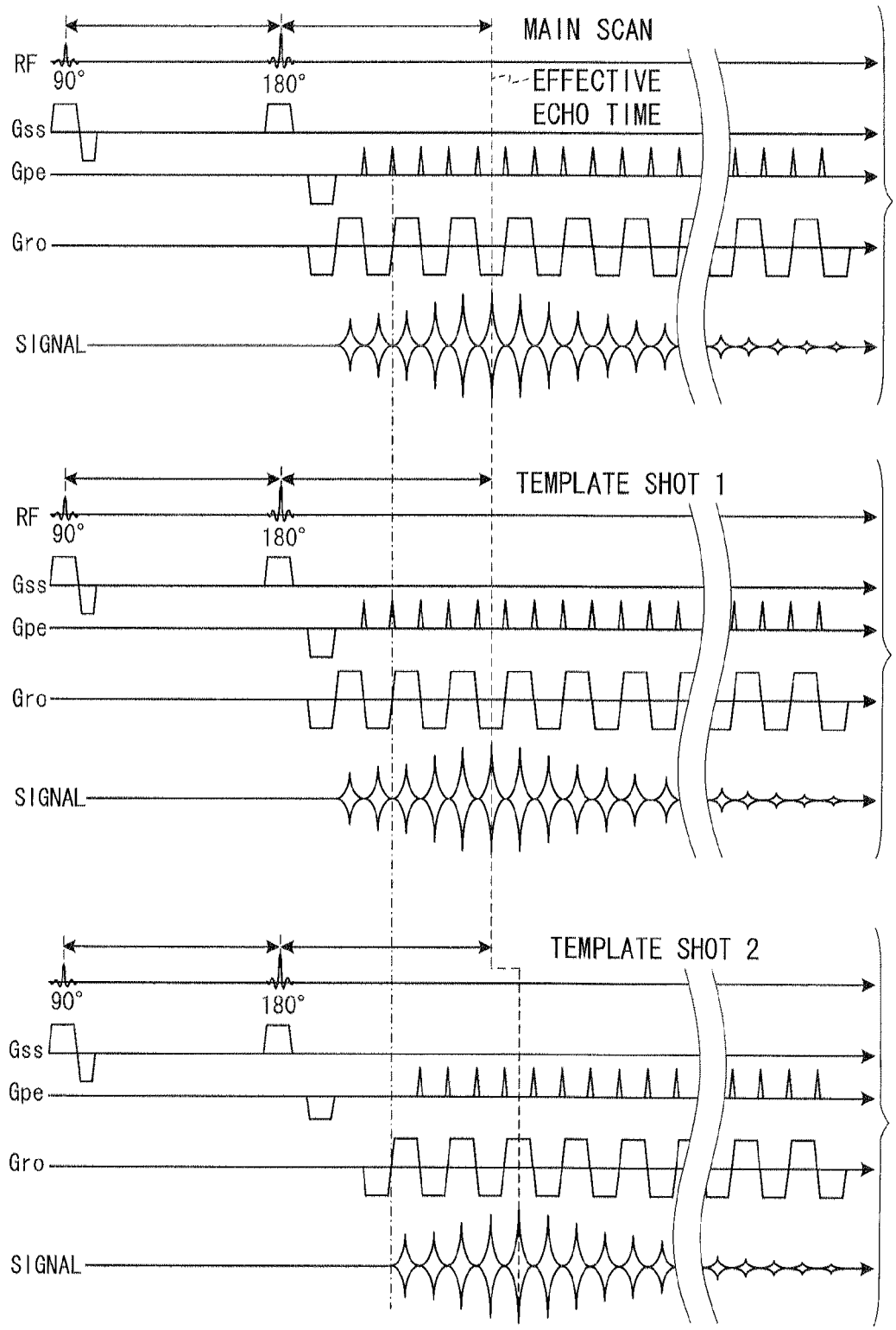
FIG. 3 is a timing diagram showing an example of pulse sequences for the main scan and the template shots 1 and 2 in the first embodiment.

FIG. 3 is a timing diagram showing an example of pulse sequences for the main scan and the template shots 1 and 2. The upper part of FIG. 3 shows the pulse sequences for the main scan (MAIN SCAN), the middle part of FIG. 3 shows the pulse sequences for the template shot 1 (TEMPLATE SHOT 1), the lower part of FIG. 3 shows the pulse sequences for the template shot 2 (TEMPLATE SHOT 2), and each abscissa axes indicates the elapsed time t. In the upper, middle and lower parts of FIG. 3, RF represents an RF pulse, Gss represents a gradient magnetic field in a slice selection direction, Gpe represents a gradient magnetic field in a phase encoding direction, Gro represents a gradient magnetic field in a readout direction, and Signal represents an echo (MR signal). A characteristic of this embodiment is that the gradient magnetic field in the phase encoding direction is applied in the template shots 1 and 2.

In the main scan shown in FIG. 3, a spin-echo single-shot EPI is used as an example. That an excitation pulse with a flip angle of 90° (RF pulse) is applied, and then, a 180° excitation pulse is applied when a half of an effective echo time is elapsed to acquire MR signals. In this example, the pulse sequences for the template shot 1 are the same as those for the main scan.

The pulse sequences for the template shots 1 and 2 differ in the following two points.

The first difference is that the "timing of start of application" of a "phase encode step pulse" and the timing of start of application of the gradient magnetic field in the readout direction Gro are delayed in the template shot 2 by twice an "echo interval" compared with those in the template shot 1.

The criterion of the timing of start of application is the time of start of application of the 180° RE pulse, for example. In this example, common timings of start of application of the 90° RE pulse and the 180° RE pulse are used in the main scan and the template shots 1 and 2 (the same holds true for the template shot 2' in the second embodiment described later and the template shot 3 in the third embodiment described later).

The "echo interval" refers to a length of time required after the polarity of the gradient magnetic field in the readout direction Gro is inverted and before the polarity is inverted again, and referred to as a "Gro inversion interval" hereinafter. Thus, the timing of start of occurrence of an echo (MR signal) with respect to the time of application of the 90° excitation pulse in the template shot 2 is delayed by twice the Gro inversion interval compared with the timing in the template shot 1.

In the example of the gradient magnetic field in the phase encoding direction Gpe in FIG. 3, the "phase encode step pulse" refers to a gradient magnetic field pulse in the phase encoding direction other than a prepulse, which is applied first. The phase encode step pulses are applied at the Gro inversion intervals. The prepulse is shown in FIG. 3 as a trapezoid below the abscissa axis (time axis). For the gradient magnetic field in the phase encoding direction Gpe, only the prepulse applied first differs from the other pulses, and the second and the following phase encode step pulses applied at predetermined time intervals are the same.

Since the phase encode step pulses are applied in synchronization with inversions of the gradient magnetic field in the readout direction, positional information in the phase encoding direction is added to the MR signals that consecutively occur as the gradient magnetic field is inverted.

The second difference between the template shots 1 and 2 is the absolute value of the time-integrated value of the application intensity of the prepulse of the gradient magnetic field in the phase encoding direction Gpe (although the timing of application of the prepulse is the same).

More specifically, an MR signal received at the timing of the zero phase encode step is arranged as a center line of k-space data. In the case of the single shot EPI, the timing of the zero phase encode step is the timing when the total area of the phase encode step pulses consecutively applied at predetermined intervals is equal to the area of the prepulse of the gradient magnetic field in the phase encoding direction Gpe.

The above term area refers to the absolute value of the time-integrated value of the signal intensity. The expression zero phase encode step refers to a step of acquiring an MR signal without applying the gradient magnetic field in the phase encoding direction Gpe in the case of the ordinary spin echo method where each MR signal is acquired each time the phase encode step is varied.

In the template shot 1, the following two timings are the same. One is the timing at which the phases of the spins of the nuclei of all the hydrogen atoms in a selected slice (or the directions of the traverse magnetization vectors of the spins) are supposed to be aligned because of the application of the 90° RF pulse and the 180° RF pulse in the spin echo method, and thus the intensity of the MR signal is at the maximum. In FIG. 3, this timing is shown by a vertical dashed line as the effective echo time (EFFECTIVE ECHO TIME). The other is the timing at which the signal intensity is supposed to be at the maximum because of the gradient magnetic field in the phase encoding direction, or in other words, the timing of the zero phase encode step.

Thus, in the template shot 1, the area of the first prepulse of the gradient magnetic field in the phase encoding direction Gpe is equal to the sum of the areas of the following five phase encode step pulses. In this case, at the effective echo time shown by the dashed line in FIG. 3, the MR signal with the maximum signal intensity is acquired, and the data is arranged on the center line of the k-space.

On the other hand, in the template shot 2, the area of the first prepulse of the gradient magnetic field in the phase encoding direction Gpe is equal to the sum of the following four phase encode step pulses. In addition, in the template shot 2, the timing of start of occurrence of the MR signal is delayed by a time corresponding to two echoes, since the timing of start of application of the gradient magnetic field in the readout direction is delayed compared with the timing in the template shot 1. Therefore, in the template shot 2, the MR signal acquired immediately after application of the fourth phase encode step pulse (counted from the temporally first) corresponds to the zero phase encode step and is arranged on the center line of the k-space (the MR signal has the maximum intensity).

Thus, in the template shot 2, the timing of acquisition of the MR signal on the center line of the k-space (the timing of the zero phase encode step) is delayed by a time corresponding to one echo compared with the timing in the template shot 1. Therefore, the phase of the phase image obtained by the template shot 2 leads the phase of the phase image obtained by the template shot 1 because of the non-uniformity of the static magnetic field or the like.

Thus, a subtraction between the data acquired by the template shot 1 and the data acquired by the template shot 2 can be used to generate phase correction data used for correcting the phase error and to generate a magnetic field correction map.

Thus, the principle of a first embodiment involves the following two conditions.

A first condition is that, from the viewpoint of generation of the magnetic field correction map, the timing of occurrence of the MR signal corresponding to the zero phase encode step preferably differs between the template shots 1 and 2 (by a natural number multiple of the Gro inversion interval, for example). The term differ is relative to the time of start of application of the prepulse of the gradient magnetic field in the phase encoding direction Gpe or the time of start of application of the 180° RF pulse.

A second condition is that, from the viewpoint of generation of the phase correction data, the polarities of the magnetic field in the readout direction Gro at the timing of the zero phase encode step in the template shots 1 and 2 are opposite to each other. A subtraction between the data obtained by the two template shots, in which the polarity of the gradient magnetic field in the readout direction at that timing is opposite, can cancel the phase error component due to the non-uniformity of the static magnetic field, so that the phase error component can be selectively extracted.

Thus, in the case where the phase correction data is to be generated without generating the magnetic field correction map, the first condition does not have to be met, so that the same timing of occurrence of the MR signal corresponding to the zero phase encode step can be used in the template shots 1 and 2 (see the second embodiment described later and FIG. 12).

Similarly, in the case where the generation of the phase correction data is not considered and only the generation of the magnetic field correction map is considered, the second condition does not have to be met. In other words, the same polarity of the gradient magnetic field in the readout direction Gro at the timing of the zero phase encode step can be used in the two template shots 1 and 2. This will be described later with regard to the template shots 1 and 3 in the third embodiment with reference to FIG. 14.

In the first embodiment, because both the magnetic field correction map and the phase correction data are generated, the template shots 1 and 2 meet both the first and second conditions.

Specifically, in the example of the template shot 1 shown in FIG. 3, the zero phase encode step occurs at the effective echo time indicated by the dashed line, and the polarity of the gradient magnetic field in the readout direction Gro at this timing is negative.

On the other hand, in the template shot 2, the timing of the zero phase encode step is delayed compared with the timing in the template shot 1 by a time corresponding to the Gro inversion interval (one echo), and the polarity of the gradient magnetic field in the readout direction Gro at this timing is positive.

In the example shown in FIG. 3, the difference in timing of start of occurrence of the MR signal between the template shots 1 and 2 is twice the Gro inversion interval. However, the difference may be other natural number multiples of the Gro inversion interval. The difference can be changed by appropriately shifting the timings of start of application of the phase encode step pulse and the gradient magnetic field in the readout direction Gro.

In this embodiment, the data acquired in the template shots 1 and 2 described above are used to generate the magnetic field correction map and the phase correction data. First, a method of generating the phase correction data will be described.

First, a real part of k-space data is obtained by subtracting a cosine function of a carrier frequency from each MR signal acquired in the template shot 1 (referred to as template data 1 hereinafter), for example. Besides, an imaginary part of the k-space data is obtained by subtracting a sine function of the carrier frequency from the template data 1, for example. In the following, an example of a unit of generating the k-space data will be specifically described with reference to FIG. 4.

Figure 4:
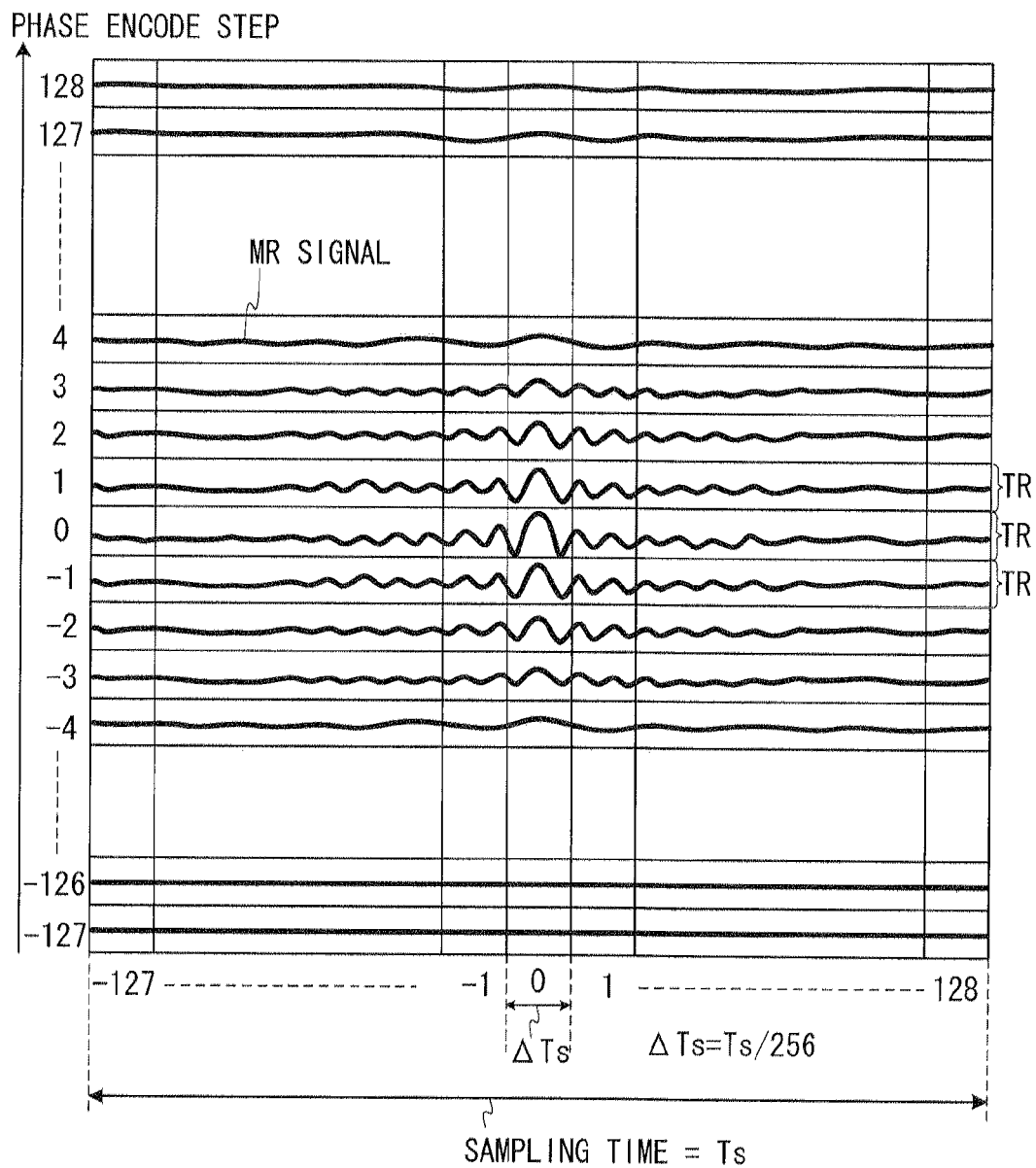
FIG. 4 is a schematic diagram showing an example of an arrangement sequence of MR signals in a k-space in the case where the number of phase encoding and frequency encoding matrix elements is 256 by 256.

FIG. 4 is a schematic diagram showing an example of an arrangement sequence of MR signals in a k-space in the case where the number of phase encoding and frequency encoding matrix elements is 256 by 256. In FIG. 4, TR represents a repetition time, Ts in the abscissa axis direction represents a sampling time, and the longitudinal axis indicates the phase encode step.

In a pulse sequence according to the ordinary spin echo method, the gradient magnetic field in the phase encoding direction is changed 256 times to acquire 256 lines of MR signals, and a cosine function or sine function of the carrier frequency is subtracted from each of the MR signals. The 256 MR signals processed in this way are arranged in the order of the phase encode steps from the bottom, such as $-127, -126, \ldots, -1, 0, 1, \ldots, 127, 128$ shown in FIG. 4. In this way, matrix data formed by 256 by 256 matrix elements, that is, the real part or the imaginary part of the k-space data is obtained.

On the other hand, in the single shot EPI such as that according to this embodiment, if only four lines of MR signals are acquired before the timing of the zero phase encode step, the number of lines of MR signals acquired is 132 (256/2+4). In this case, the 124 lines of MR signals that are not acquired are allotted 0 as data in the k-space, for example.

In the case of the template shot 1, MR signals in the lines of the phase encode steps $-127$ to $-6$ are 0, for example (see FIG. 4). The MR signals acquired in the template shot 1 are temporally arranged in the order of the phase encode steps $-5, -4, -3, -2, -1, 0, 1, \ldots, 127, 128$. That is, in the template shot 1, the MR signal acquired temporally first is arranged in the k-space in the line of the phase encode step $-5$. In the template shot 1, the MR signal acquired temporally sixth is arranged in the line of the zero phase encode step in the k-space (the center line of the k-space).

In the abscissa axis direction in FIG. 4, the intensity of the MR signals is indicated as matrix values at intervals of $\Delta Ts$, which is the sampling time Ts of each MR signal equally divided by 256. In this way, matrix data in 256 rows and 256 columns is determined for each of the real number and the imaginary number. This is the k-space data.

Then, a 1-dimensional inverse Fourier transformation is performed on the data on the center line of the real part of the k-space data obtained from the template data 1, thereby "data that represents the frequency on the abscissa axis and the spectrum intensity on the longitudinal axis" is obtained. Then, this data resulting from the 1-dimensional inverse Fourier transform is integrated over a frequency range of $-\infty$ to $+\infty$ (in units of hertz or radian), and the resulting value is denoted as Real1.

Similarly, the 1-dimensional inverse Fourier transformation is performed on the data on the center line of the imaginary part of the k-space data obtained from the template data 1, the resulting data is integrated over the frequency range of $-\infty$ to $+\infty$, and the resulting value is denoted as Imag1. Then, a phase angle Ph1 of the template data 1 is calculated according to the following formula that involves arctangent.

$$Ph1 = \arctan(Imag1/Real1) \quad (1)$$

Similarly, the real part and the imaginary part of the k-space data are obtained by subtracting the cosine function and the sine function of the carrier frequency from each of the MR signals acquired in the template shot 2 (referred to as template data 2 hereinafter), respectively, for example. Then, the 1-dimensional inverse Fourier transformation is performed on the data on the center line of the real part of the k-space data obtained from the template data 2, the resulting data is integrated over the frequency range of $-\infty$ to $+\infty$, and the resulting value is denoted as Real2.

Similarly, the 1-dimensional inverse Fourier transformation is performed on the data on the center line of the imaginary part of the k-space data obtained from the template data 2, the resulting data is integrated over the frequency range of $-\infty$ to $+\infty$, and the resulting value is denoted as Imag2. Then, a phase angle Ph2 of the template data 2 is calculated according to the following formula (2).

$$Ph2 = \arctan(Imag2/Real2) \quad (2)$$

The phase angles Ph1 and Ph2 are used as the phase correction data. In reconstruction of image data from the MR signals acquired in the main scan, phase correction is performed based on the phase correction data.

Next, a method of generating a magnetic field correction map in the case where the number of phase encode steps and the number of frequency encode steps are 256 will be described. However, the number of phase encode steps and the number of frequency encode steps may be values other than 256.

First, as a first phase image, a phase image including 256 by 256 pixels is generated by using the real part and the imaginary part of the k-space data obtained from the template data 1. More specifically, an arctangent of the ratio between "each of the 256 by 256 matrix elements of the real part of the k-space data" and "the matrix element at the corresponding position of the 256 by 256 matrix elements of the imaginary part of the k-space data" is calculated.

For example, it is assumed that the value of the matrix element in the first row and first column of the real part of the k-space data is "a", and the value of the matrix element in the first row and first column of the imaginary part of the k-space data is "b".

Then, an angle $\theta$ defined as $\theta = \arctan(b/a)$ is calculated, and the angle $\theta$ is regarded as the value of the matrix element in the first row and first column for the first phase image. Then, all the values of the 256 by 256 matrix elements are calculated in the same way, and a 2-dimensional Fourier transformation is performed on the data on the calculated matrix element values to generate the first phase image including 256 by 256 pixels.

The phase image for the template data 2 is also generated in the same way. The phase image is used as a second phase image.

Then, the difference between "the value of each pixel of the first phase image" and "the value of the pixel at the corresponding position of the second phase image" is calculated, and then, the differences are multiplied by a predetermined coefficient to generate a subtracted image (including 256 by 256 pixels).

More specifically, for example, the value of the pixel in the first row and first column of the first phase image is denoted by $\theta 1$, and the value of the pixel in the first row and first column of the second phase image is denoted by $\theta 2$. Then, a value $\theta$sub expressed by the following formula (3) is defined as the value of the pixel in the first row and first column of the subtracted image.

$$\theta \text{sub} = \gamma \times (\theta 1 - \theta 2)/DT \quad (3)$$

In the formula (3), $\gamma$ represents a gyromagnetic ratio of a hydrogen atom (42.6 MHz/T), and DT represents a time difference (in seconds) between the times of start of data acquisition in the template shots 1 and 2 shifted with respect to each other.

In the example shown in FIG. 3, DT is twice the Gro inversion interval. The subtracted image is also generated for the other pixels by calculating the pixel values according to the formula (3) in the same way. The subtracted image between the first phase image and the second phase image generated in this way is the magnetic field correction map.

More specifically, in the template shot 1 shown in FIG. 3, the gradient magnetic field in the phase encoding direction Gpe is applied so that the data on the MR signal at the effective echo time according to the spin echo method is arranged on the center line of the k-space. Since the phases of the spins of all the hydrogen atom nuclei in the selected slice are ideally aligned with each other because the 90° RF pulse and the 180° RF pulse are applied, if the data on the MR signal at the effective echo time according to the spin echo method is arranged at the center of the k-space, the first phase image generated is a substantially symmetrical magnetic field map.

On the other hand, in the template shot 2, the timing at which the intensity of the MR signal is supposed to be at the maximum and the timing of the zero phase encode step differ by the Gra inversion interval because of the application of the 90° RF pulse and the 180° RF pulse in the spin echo method as described above.

As a result, in the template shot 2, the generated second phase image provides an asymmetrical magnetic field map because of the phase difference. In other words, the second phase image generated in the template shot 2 provides a magnetic field map in which the magnetic field is less uniform than the map generated in the template shot 1. Thus, the subtracted image between the first phase image and the second phase image generated as described above can be used as the magnetic field correction map.

Figure 5:
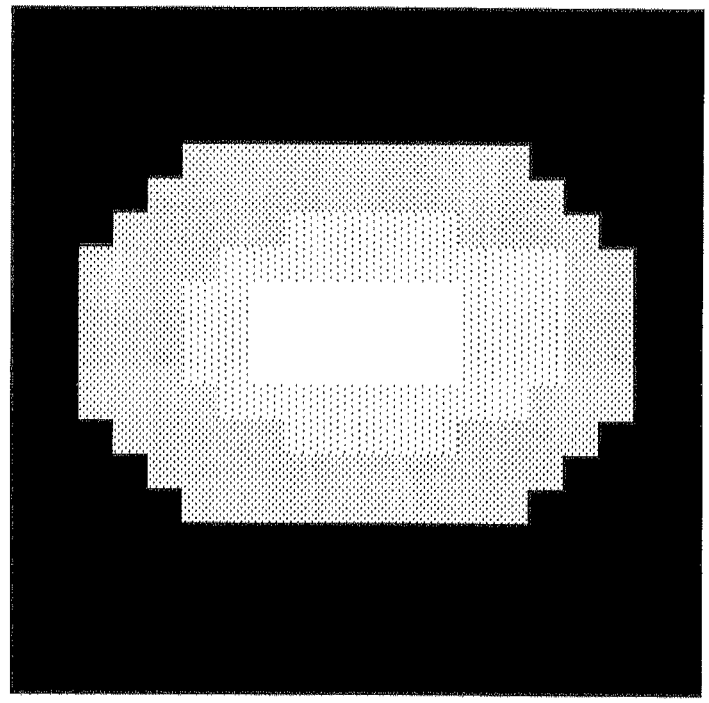
FIG. 5 is a schematic diagram showing an example of the first phase image obtained from the template data 1.

FIG. 5 is a schematic diagram showing an example of the first phase image obtained from the template data 1. For simplicity, in FIG. 5, the number of pixels is reduced to 20 by 20 (the same holds true for FIGS. 6 and 7 described later). In FIG. 5, pixels with higher pixel values are shown lighter (with higher brightness levels), and pixels with lower pixel values are shown darker (the same holds true for FIGS. 6, 7, 8 and 9 described later). As shown in FIG. 5, the first phase image obtained from the template shot 1 provides a substantially symmetrical magnetic field map.

Figure 6:
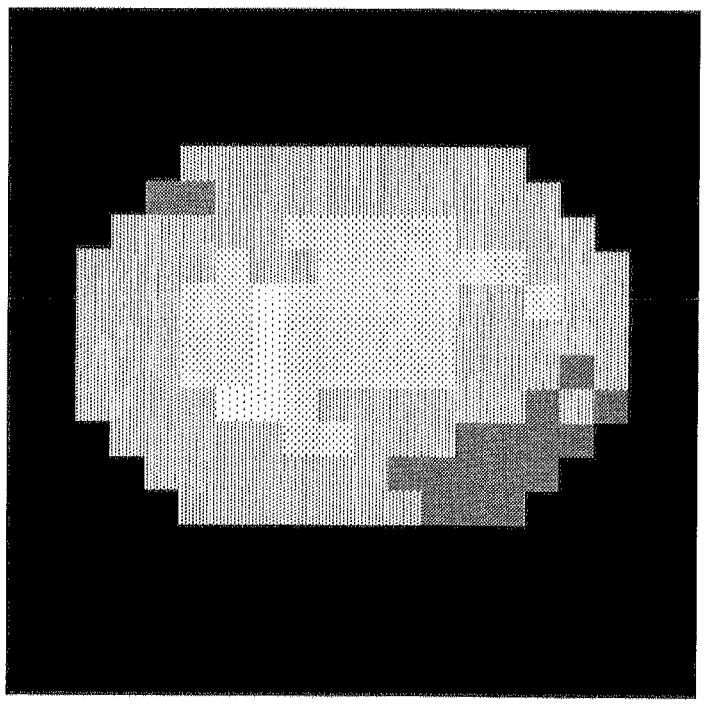
FIG. 6 is a schematic diagram showing an example of the second phase image obtained from the template data 2.

FIG. 6 is a schematic diagram showing an example of the second phase image obtained from the template data 2. As shown in FIG. 6, the second phase image obtained from the template shot 2 is less symmetrical than the first phase image obtained from the template shot 1.

Figure 7:
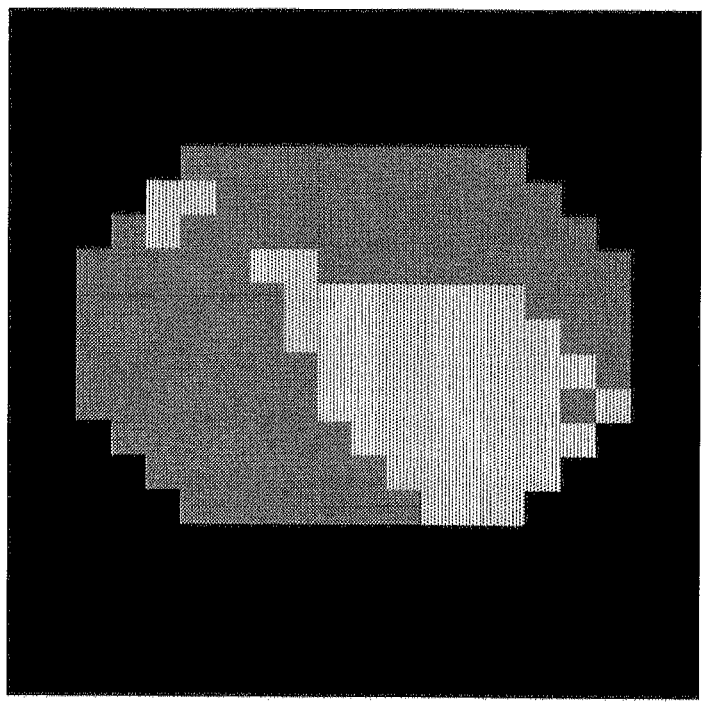
FIG. 7 is a schematic diagram showing an example of the subtracted image (magnetic field correction map) obtained from the first phase image and the second phase image according to the formula (3)

FIG. 7 is a schematic diagram showing an example of the subtracted image (magnetic field correction map) obtained from the first phase image and the second phase image according to the formula (3). As shown in FIG. 7, a subtraction between the phase images obtained by the template shots 1 and 2 allows the phase difference to be expressed as a gradient in pixel value.

Figure 8:
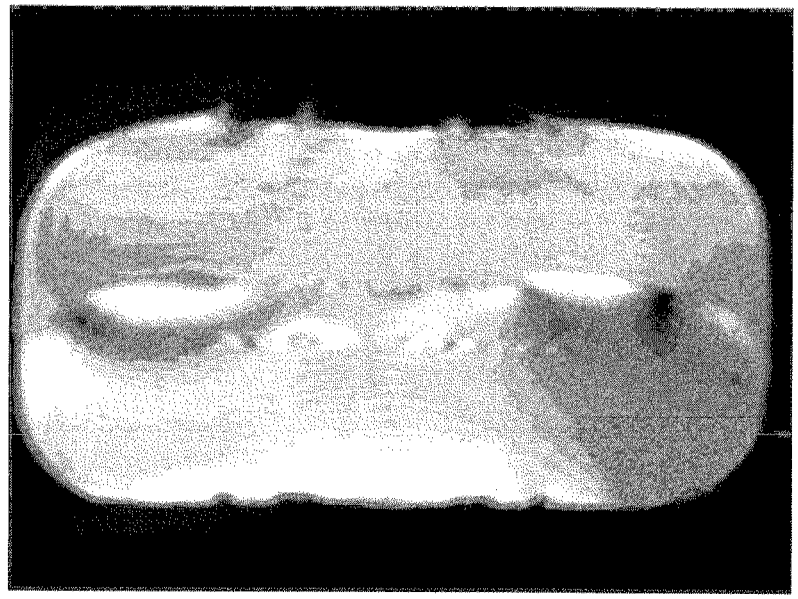
FIG. 8 shows an example of an image of a uniform phantom taken without performing the correction of the non-uniformity of the static magnetic field based on the magnetic field correction map before the main scan.

FIG. 8 shows an example of an image of a uniform phantom taken without performing the correction of the non-uniformity of the static magnetic field using the magnetic field correction map before the main scan.

Figure 9:
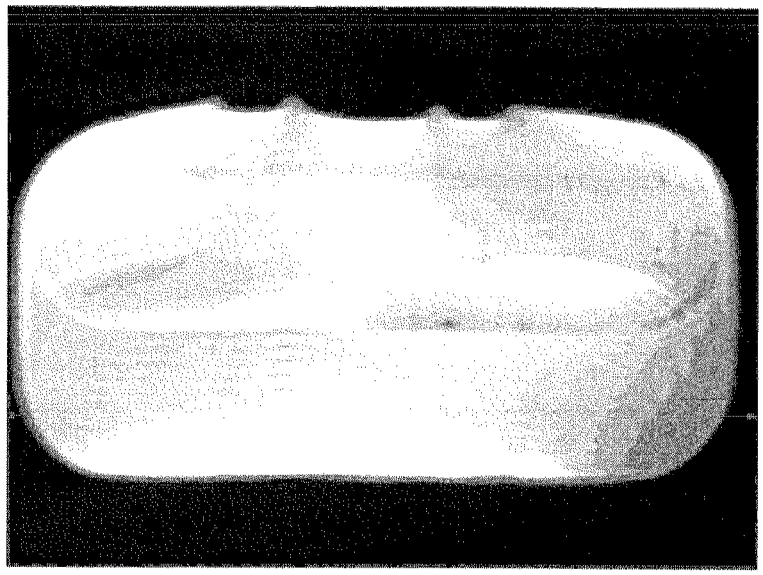
FIG. 9 shows an example of an image of the same phantom as that in FIG. 8 taken by performing the correction of the non-uniformity of the static magnetic field by using the magnetic field correction map before the main scan.

FIG. 9 shows an example of an image of the same phantom as that in FIG. 8 taken by performing the correction of the non-uniformity of the static magnetic field using the magnetic field correction map before the main scan.

Figure 10:
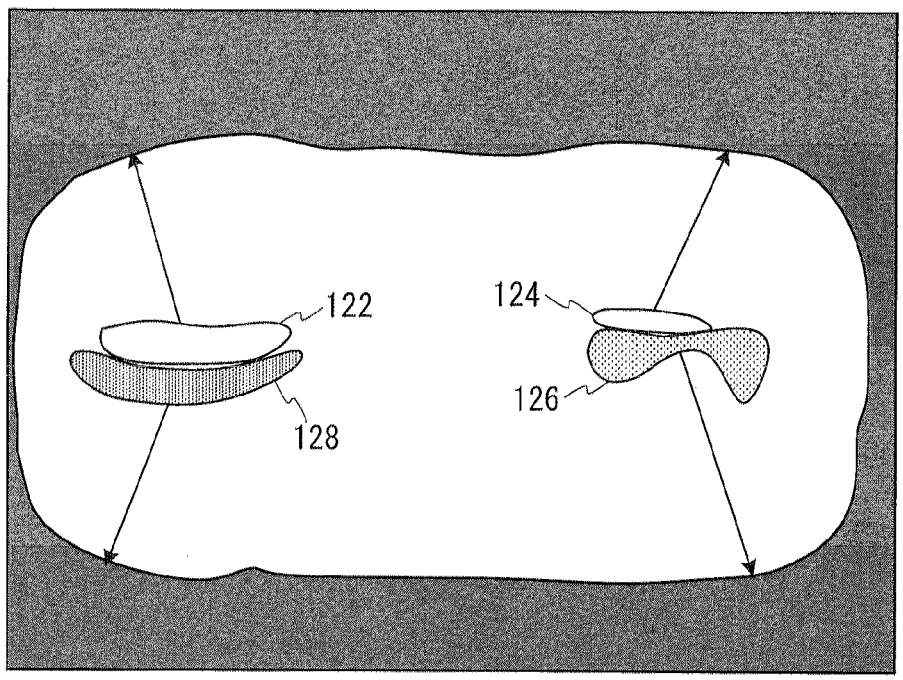
FIG. 10 is a schematic diagram for illustrating the difference between the case where the correction based on the magnetic field correction map is not performed (FIG. 8) and the case where the correction is performed (FIG. 9).

FIG. 10 is a schematic diagram for illustrating the difference between the case where the correction using the magnetic field correction map is not performed (FIG. 8) and the case where the correction is performed (FIG. 9). Four distorted regions are extracted from the image shown in FIG. 8, and reference numerals 122, 124, 126 and 128 in FIG. 10 denote the distorted regions.

As can be seen from comparison between FIGS. 8 and 10, in the case where the correction using the magnetic field correction map is not performed, the four distorted regions 122, 124, 126 and 128 appear. As shown in FIG. 9, in the case where the correction using the magnetic field correction map is performed, the distorted region 122 moves to an upper left outer perimeter of the phantom, the distorted region 124 moves to an upper right outer perimeter of the phantom, the distorted region 126 moves to a lower right outer perimeter of the phantom, and the distorted region 128 moves to a lower left outer perimeter of the phantom. Thus, the distortion is significantly removed, and the uniformity of the phantom, which is intrinsically uniform, is improved compared with the case shown in FIG. 8.

Figure 11:
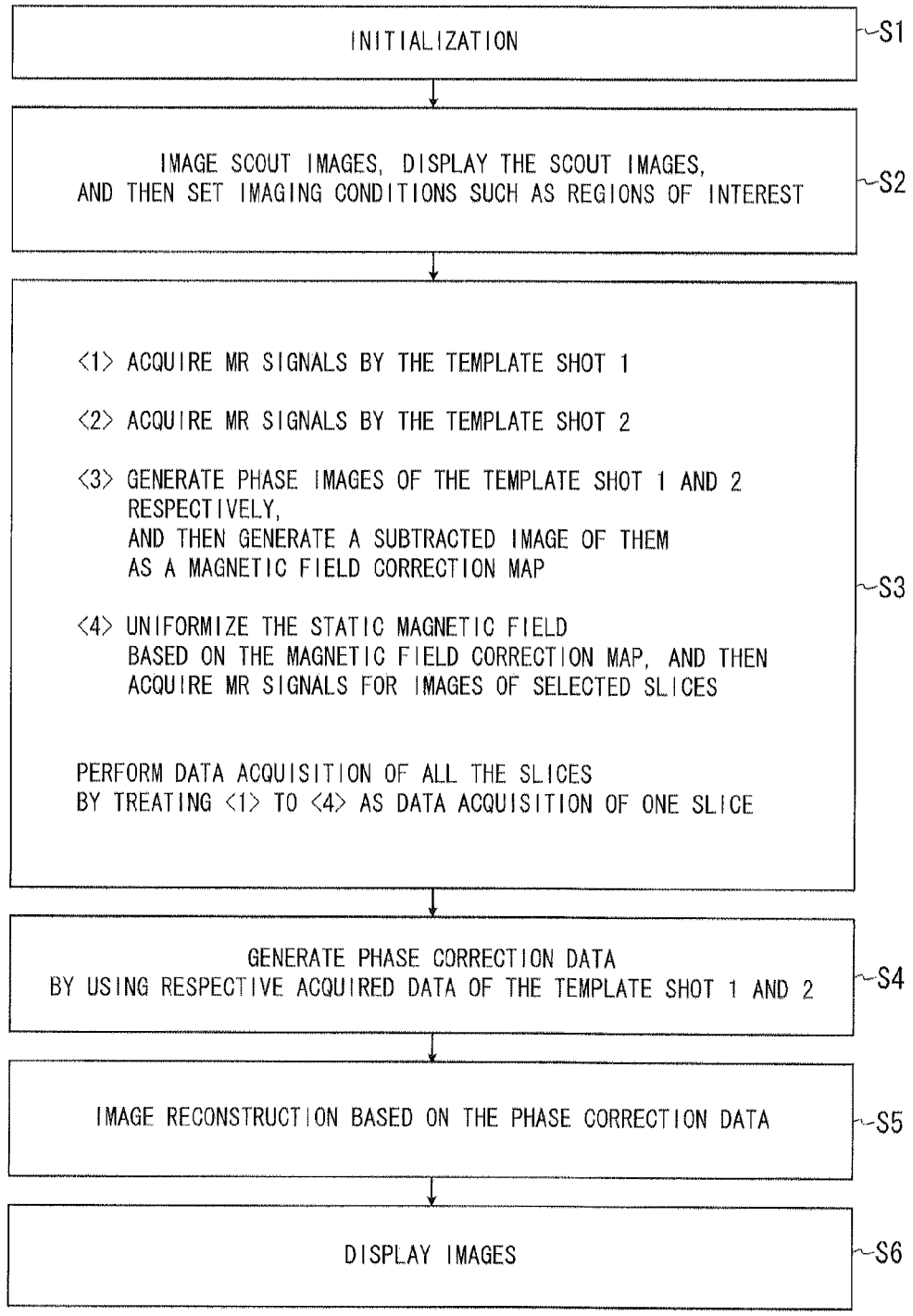
FIG. 11 is a flowchart illustrating a flow of a process performed by the MRI apparatus of the first embodiment.

FIG. 11 is a flowchart illustrating a flow of a process performed by the MRI apparatus 20 of the first embodiment. In the following, according to the step numbers in the flowchart shown in FIG. 11, an operation of the MRI apparatus 20 will be described by referring to the aforementioned each figure as required.

[step S1] The MPU 86 (see FIG. 2) performs initial setting of the MRI apparatus 20 based on imaging conditions inputted to the MRI apparatus 20 via the input device 62. As part of the initial setting, a provisional central frequency of the RF pulse used in imaging of a scout image is set, for example.

[Step S2] The sequence controller 56 drives the bed control system (not shown) to move the bed 32 (see FIG. 1) so as to bring an imaging part of an object P to the center of a magnetic field in a gantry, which is an imaging space. The "imaging part" means a region of the object P to be imaged, such as a head, a chest, an abdomen, a lumber and a leg.

Then, the MRI apparatus 20 transmits an RF pulse or the like for acquiring data on a scout image, and the RF receiver 48 detects an MR signal. The RF receiver 48 performs a predetermined signal processing on the MR signal to generate raw data, which is a digitalized version of the MR signal, and inputs the raw data to the sequence controller 56.

The sequence controller 56 inputs the raw data on the MR signal to an image reconstruction unit 90, and the image reconstruction unit 90 performs a predetermined processing on the raw data to generate image data on the scout image and inputs the image data to the image database 94.

The image processing unit 96 performs a predetermined processing on the inputted image data, and the storage device 66 stores the processed image data on the scout image. Then, the display control unit 98 makes the display device 64 display the scout image under an instruction from the MPU 86, and an imaging condition, such as a region of interest, is set based on the scout image.

[Step S3] The MRI apparatus 20 performs two kinds of template shots for generating phase correction data and magnetic field correction data as a prescan according to the flow <1> to <4> described below, and then performs data acquisition for target images (a main scan).

The template shots 1 and 2 described below are performed for the spatially same region that is the same as the imaging region for the main scan.

<1> As pulse sequences for the template shot 1, the MPU 86 sets the same pulse sequences as the pulse sequences for the main scan set based on the imaging condition inputted in Step S2 and the preceding steps (see FIG. 3). Then, the MPU 86 inputs the pulse sequences for the template shot 1 to the sequence controller 56 and instructs to start data acquisition.

In response to this, the MRI apparatus 20 transmits the RF pulse or the like for data acquisition according to the pulse sequence for the template shot 1, and the RF receiver 48 detects the MR signal.

The sequence controller 56 inputs the raw data on the MR signal detected by the RF receiver 48 generated by the RF receiver 48 to the image reconstruction unit 90.

The image reconstruction unit 90 places the raw data in the k-space formed in the k-space database 92 as k-space data for the template shot 1.

<2> As pulse sequences for the template shot 2, the MPU 86 sets pulse sequences in which the phase encode step pulse and the timing of start of application of the gradient magnetic field in the readout direction Gro are delayed compared with those for the template shot 1. In addition, the MPU 86 sets the polarities of the gradient magnetic field in the readout direction Gro in the template shots 1 and 2 to be opposite at the timing of the zero phase encode step. The difference between the template shots 1 and 2 has already been described in detail with reference to FIG. 3 and will not be described further.

Then, the MPU 86 inputs the pulse sequences for the template shot 2 to the sequence controller 56 and instructs to start data acquisition. As a result, k-space data for the template shot 2 is placed in the k-space formed in the k-space database 92 as in <1> described above.

<3> The correction unit 100 acquires the k-space data for the template shots 1 and 2 from the k-space database 92 in the image reconstruction unit 90, and generates "a first phase image which is a phase image for the template shot 1", and "a second phase image which is a phase image for the template shot 2".

Then, the correction unit 100 generates a subtracted image from the first and second phase images according to the formula (3), and inputs the subtracted image to the MPU 86 as the magnetic field correction map. The method of generating the first and second phase image and the subtracted image has already been described above.

<4> A correction (shimming) for uniformizing the static magnetic field is performed based on the magnetic field correction map, and then, the main scan is performed to acquire MR signals under the set imaging condition.

To this end, the MPU 86 calculates an offset magnetic field that cancels the non-uniformity of the magnetic field shown by the magnetic field correction map to uniformize the static field.

Then, the MPU 86 controls each unit via the sequence controller 56, so that the offset magnetic field is applied so as to be superposed on the static magnetic field. In general, shimming of a non-uniformity component of the second or higher order of the static magnetic field can be achieved by adjusting the current supplied to the shim coil 24, for example. Shimming of a non-uniformity component of the first order of the static magnetic field can be achieved by adjusting the currents supplied to the X-axis gradient coil 26x, the Y-axis gradient coil 26y and the Z-axis gradient coil 26z, for example.

As concrete operation, first, a static magnetic field is formed in the imaging space by the static magnetic field magnet 22 excited by the static magnetic field power supply 40. Then, when the MPU 86 receives a command of start of imaging from the input device 62, the MPU 86 inputs imaging conditions including a pulse sequence of the main scan into the sequence controller 56.

The sequence controller 56 drives the gradient magnetic field power supply 44, the RF transmitter 46 and the RF receiver 48 according to the inputted pulse sequence, thereby a gradient magnetic field Gss in the slice selection direction, a gradient magnetic field Gpe in the phase encoding direction and a gradient magnetic field Gro in the readout direction are formed in the imaging region, and RF signals are generated from the RF coil 28.

The currents supplied from the gradient magnetic field power supply 44 to the X-axis, Y-axis and Z-axis gradient coils 26x, 26y and 26z contain superposed components that are intended to generate the offset magnetic field. Thus, this is substantially equivalent to uniformalization of the static magnetic field.

Then, MR signals generated by nuclear magnetic resonance inside the object P are received by the RF coil 28 and detected by the RF receiver 48. The RF receiver 48 to generates raw data by performing the aforementioned predetermined signal processing on the detected MR signals. The RF receiver 48 inputs the generated raw data to the sequence controller 56.

The sequence controller 56 inputs the raw data to the image reconstruction unit 90.

The image reconstruction unit 90 places the raw data in the k-space formed in the k-space database 92 as k-space data.

The MRI apparatus 20 performs the data acquisition for all the slices, by treating the aforementioned processes <1> to <4> as the data acquisition for one slice.

[Step S4] The correction unit 100 calculates the phase correction data for all the slices. Then, the correction unit 100 inputs each phase correction data to the image reconstruction unit 90 in association with the slice for which the phase correction data is calculated.

More specifically, the correction unit 100 calculates a frequency-integrated value of each data obtained by a 1-dimensional inverse Fourier transformation of the center line of the real part and the center line of the imaginary part of the k-space data for the template data 1, and then calculates the phase angle Ph1 for the template data 1 by using arctangent described above. The correction unit 100 calculates the phase angle Ph2 for the template data 2 in the same way, and the phase angles Ph1 and Ph2 are used as the phase correction data for the slice corresponding to the template data 1 and 2.

[Step S5] The image reconstruction unit 90 obtains the k-space data from the k-space database 92 and reconstructs image data of each slice by performing the image reconstruction processing including Fourier transformation on the obtained k-space data.

In the image reconstruction process, the image reconstruction unit 90 also performs a correction to remove the effect of the phase error in the MR signals by using the phase correction data calculated separately for each slice. Although the process up to the generation of the phase correction data differs from the conventional process, the phase error correction process after the generation of the phase correction data can be the same as the conventional process (see Patent Document 2 or the like), so detailed descriptions thereof will be omitted.

The image reconstruction unit 90 generates image data of all the slices in the aforementioned manner, and stores the generated image data in the image database 94.

The image processing unit 96 obtains the image data from the image database 94 and generates image data for display by performing predetermined image processing on the obtained image data. The image processing unit 96 stores the image data for 2-dimensional display in the storage device 66.

[Step S6] The display controlling unit 98 obtains the image data for display from the storage device 66 under the control of the MPU 86, and makes the display device 64 display images indicated by the obtained image data for display. The foregoing is a description of an operation of the MRI apparatus 20 according to the first embodiment.

As described above, according to the first embodiment, the template shots 1 and 2 that involve application of the gradient magnetic field in the phase encoding direction corresponding to each echo and differ in timing of start of occurrence of the echo are performed before the main scan to obtain the template data 1 and 2.

Then, based on the template data 1 and 2, the magnetic field correction map and the phase correction data are generated. Therefore, a correction to uniformize the static magnetic field in the main scan and a correction of a phase error after acquisition of MR signals in the main scan can be performed at the same time.

In this process, the correction to uniformize the static magnetic field based on the magnetic field correction map is first performed, and then, the correction of the phase error based on the phase correction data is performed after MR signals are acquired in the main scan.

That is, in the main scan, the MR signals are acquired from the imaging region to which "the static magnetic field satisfactorily uniformized based on the magnetic field correction map" is applied. Therefore, the precision of the correction of the phase error can be improved.

In addition, since the magnetic field correction data is generated based on the data acquired from the same cross section as the imaging slice, and the non-uniformity of the static magnetic field is corrected for each slice, the effect of the correction of static magnetic field is improved.

Therefore, the image distortion due to the phase error in EPI can be more significantly reduced than conventional (see FIGS. 8 and 9).

The phase error in each echo contains a component due to the non-uniformity of the static magnetic field and a component due to the other causes. Although there are various methods for correcting these components, these components are corrected separately according to the conventional methods.

The MRI apparatuses according to the second embodiment and the third embodiment have the same configuration as the MRI apparatus 20 according to the first embodiment. According to the second embodiment, the correction to uniformize the static magnetic field based on the magnetic field correction map is not performed, and only the correction of the phase error is performed. In the following, the second embodiment will be described with regard to the difference from the first embodiment.

Figure 12:
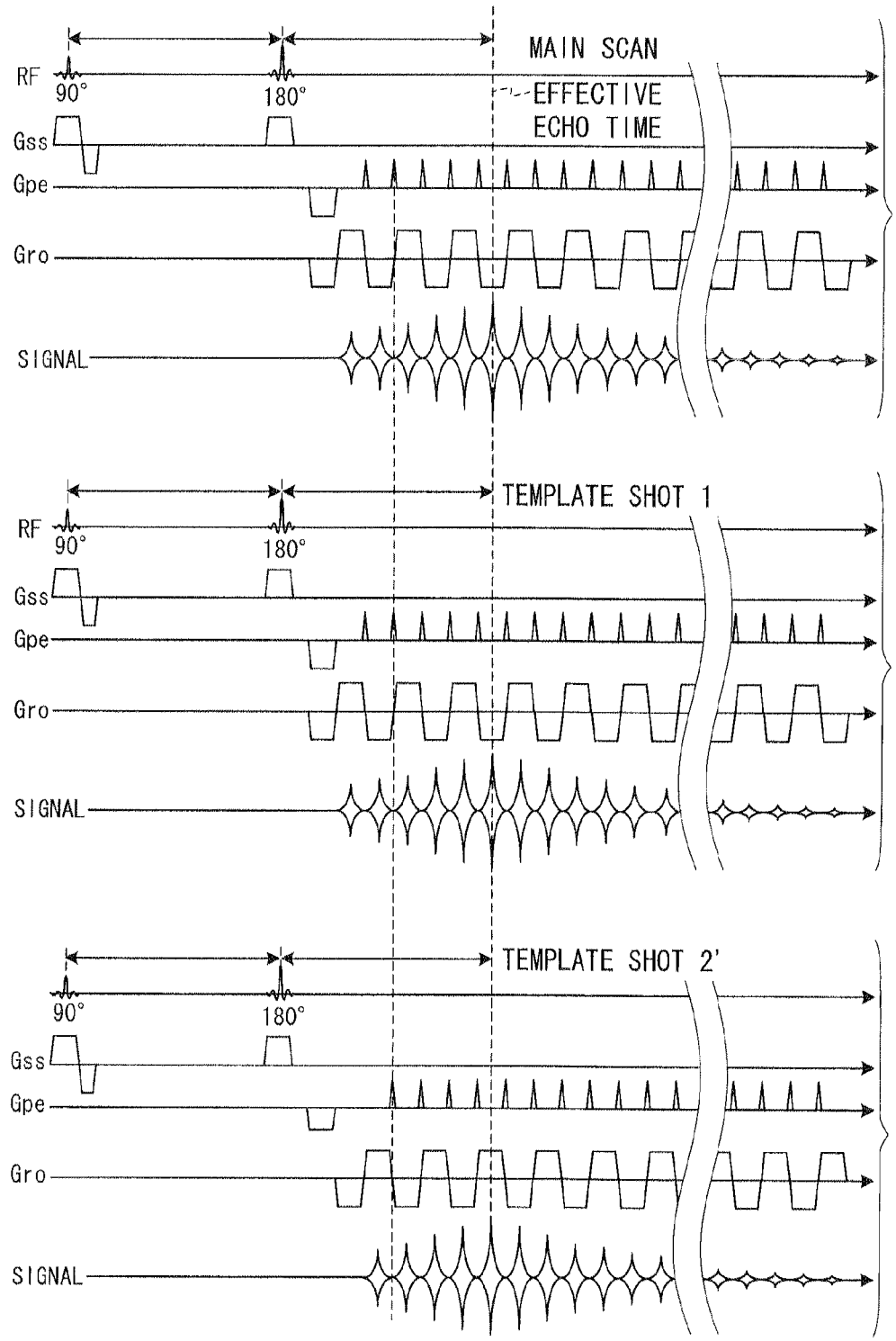
FIG. 12 is a timing chart showing an example of pulse sequences for the main scan and template shots 1 and 2' in the spin-echo single-shot EPI in the second embodiment.

FIG. 12 is a timing chart showing an example of pulse sequences for the main scan and template shots 1 and 2' in the spin-echo single-shot EPI. In FIG. 12, the definitions of the abscissa axis and the like are the same as those in FIG. 3, and the main scan shown in the upper part of FIG. 12 and the template shot 1 shown in the middle part of FIG. 12 are the same as the main scan and the template shot 1 according to the first embodiment.

In FIG. 12, only the template shot 2' (TEMPLATE SHOT 2') shown in the lower part differs from the template shot 2 according to the first embodiment.

For example, as for the timing of occurrence of the MR signal corresponding to the zero phase encode step with respect to the time of start of application of the prepulse of the gradient magnetic field in the phase encoding direction Gpe, the template shot 2' is the same as the template shot 1. This is because the magnetic field correction map is not generated in the second embodiment, although the timing of occurrence of the MR signal corresponding to the zero phase encode step have to differ between the template shots 1 and 2 to generate the magnetic field correction map.

In the template shot 2', the area of the prepulse of the gradient magnetic field in the phase encoding direction Gpe (the absolute value of the time-integrated value of the intensity) is equal to the sum of the areas of the first four phase encode step pulses. That is, in the template shot 2', the temporally fifth acquired MR signal corresponds to the zero phase encode step and has the maximum intensity.

Now, the timing of occurrence of the MR signal corresponding to the zero phase encode step (the effective echo time indicated by the vertical dashed line in FIG. 12) will be considered. The polarity of the gradient magnetic field in the readout direction Gro at this timing is negative in the template shot 1 and positive in the template shot 2'. This is because the polarities of the gradient magnetic field in the readout direction Gro at the timing of the zero phase encode step in the template shots 1 and 2' are desirably opposite to each other in order to obtain the phase correction data.

By using the template shot 1 and 2' described above, the phase correction data can be generated in the same principle as in the first embodiment.

Figure 13:
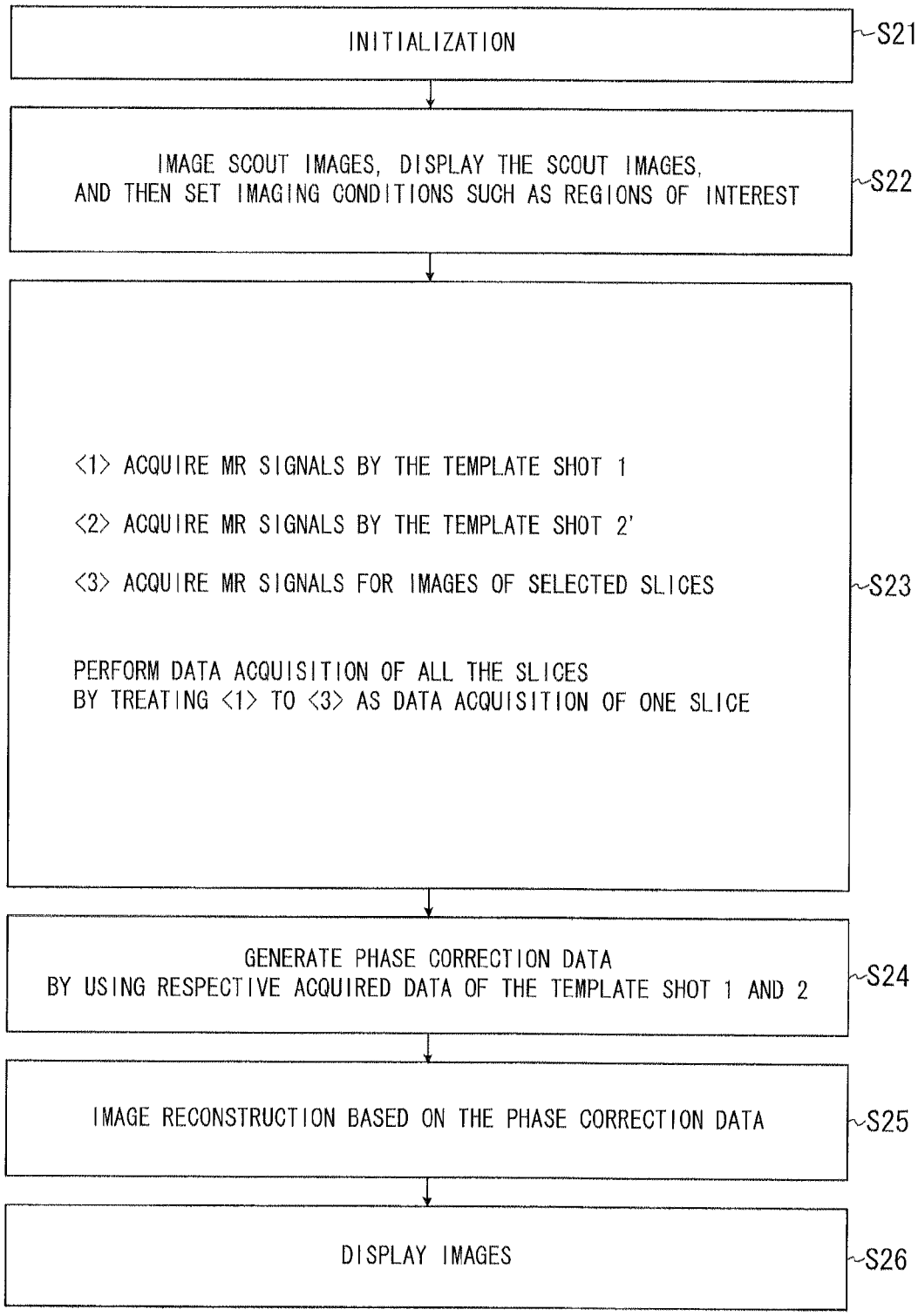
FIG. 13 is a flow chart showing a flow of an operation of the MRI apparatus according to the second embodiment.

FIG. 13 is a flow chart showing a flow of an operation of the MRI apparatus 20 according to the second embodiment. In the following, an operation of the MRI apparatus 20 according to the second embodiment will be described following the steps shown in FIG. 13.

[Step S21] As in Step S1 in the first embodiment, initial setting of the MRI apparatus 20 is performed.

[Step S22] As in Step S2 in the first embodiment, the image data on the scout image is generated, the display device 64 displays the scout image, and the imaging conditions including the region of interest are set.

[Step S23] The MRI apparatus 20 performs two kinds of template shots for generating the phase correction data as the prescan according to the flow <1> to <3> described below, and then performs the main scan. The template shots 1 and 2' are performed for the spatially same region that is the same as the imaging region for the main scan.

<1> As in <1> of Step S3 in the first embodiment, the MRI apparatus 20 performs the pulse sequences for the template shot 1. As a result, the k-space data for the template shot 1 is placed (stored) in the k-space formed in the k-space database 92.

<2> The MPU 86 sets the pulse sequences for the template shot 2' described above, inputs the pulse sequences to the sequence controller 56, and instructs to start data acquisition. As a result, the k-space data for the template shot 2' is placed in the k-space formed in the k-space database 92.

<3> Acquisition of MR signals in the main scan is performed under the set imaging conditions without performing the correction to uniformize the static magnetic field based on the magnetic field correction map. The specific operation of acquiring the MR signals is basically the same as the operation in <4> of Step S3 in the first embodiment, except that the magnetic field correction map is not used.

The MRI apparatus 20 performs the data acquisition for all the slices, by treating the aforementioned processes <1> to <3> as the data acquisition for one slice.

[Step S24] The correction unit 100 calculates the phase correction data for all the slices by using the k-space data for the template shots 1 and 2' as in Step S4 in the first embodiment. Then, the correction unit 100 inputs each calculated phase correction data to the image reconstruction unit 90 in association with the slice for which the phase correction data is calculated.

[Step S25] As in Step S5 in the first embodiment, the image reconstruction unit 90 reconstructs the image data for each slice by correcting the phase error in the MR signals based on the phase correction data for the slice. Then, as in Step S5 in the first embodiment, the image data to be displayed is generated and saved in the storage device 66.

[Step S26] As in Step S6 in the first embodiment, the image data to be displayed is displayed. This is the end of the description of the operation of the MRI apparatus 20 according to the second embodiment.

As described above, according to the second embodiment, the phase error in EPI can be reduced in the same principle as the first embodiment.

Note that in the prior art, the gradient magnetic field in the phase encoding direction Gpe is not applied in the template shots for reducing the phase error.

According to the third embodiment, as in the first embodiment, the correction to uniformize the static magnetic field based on the magnetic field correction map and the correction of the phase error are performed. In the third embodiment, three template shots are performed. In the following, the third embodiment will be described with regard to the difference from the first embodiment.

Figure 14:
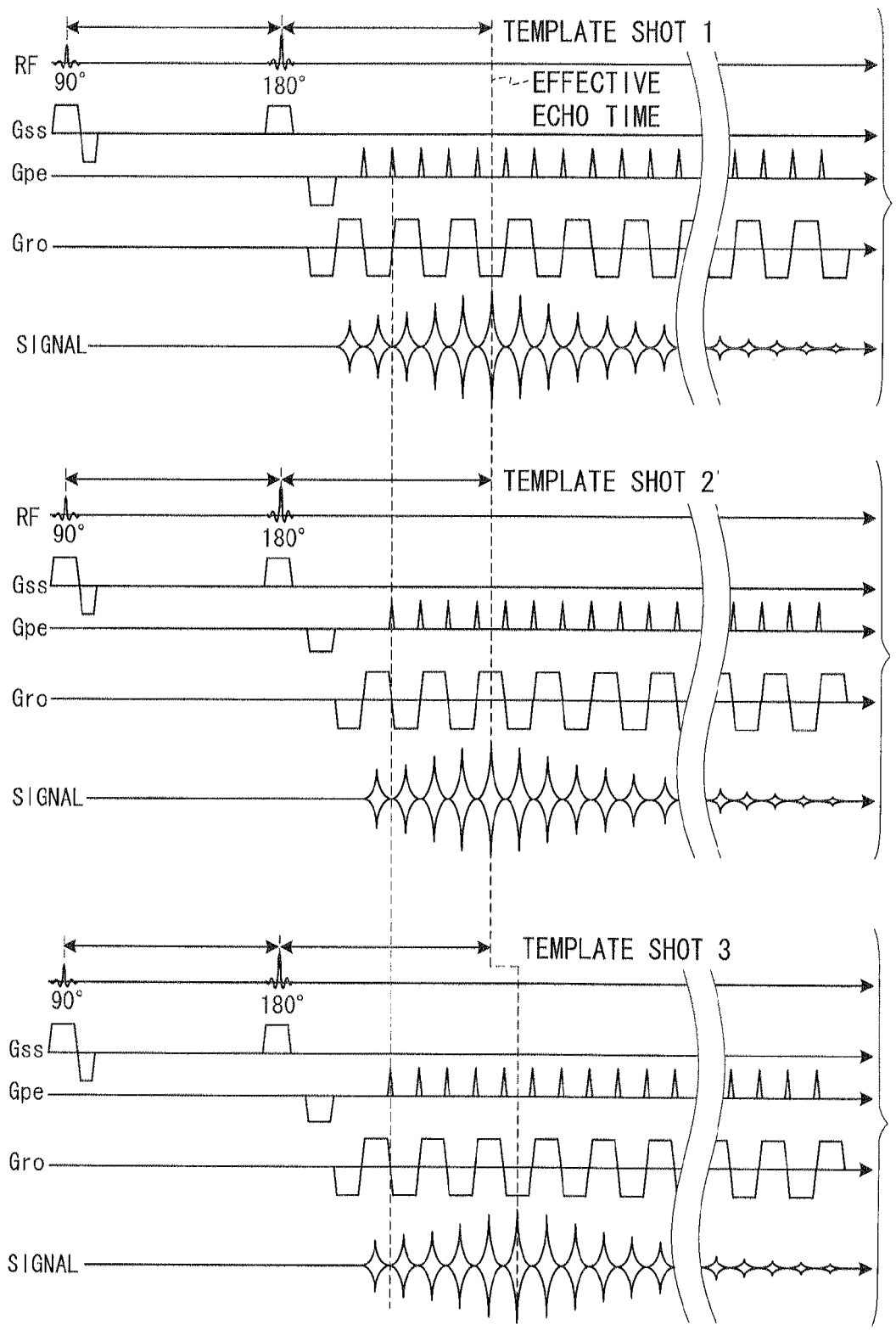
FIG. 14 is a timing chart showing an example of pulse sequences for template shots 1, 2' and 3 in the spin-echo single-shot EPI in the third embodiment.

FIG. 14 is a timing chart showing an example of pulse sequences for template shots 1, 2' and 3 in the spin-echo single-shot EPI. In FIG. 14, the definitions of the abscissa axis and the like are the same as those in FIG. 3.

The pulse sequences for the main scan according to the third embodiment is the same as "the pulse sequences for the main scan according to the first embodiment" and "the pulse sequences for the template shot 1 according to the third embodiment", and therefore are not shown in the drawing.

The template shot 1 (TEMPLATE SHOT 1) shown in the upper part of FIG. 14 is the same as the template shot 1 according to the first embodiment.

The template shot 2' (TEMPLATE SHOT 2') shown in the middle part of FIG. 14 is the same as the template shot 2' according to the second embodiment. In the third embodiment, the template shots 1 and 2' are used to generate the phase correction data to correct the phase error as in the second embodiment.

The template shot 3 (TEMPLATE SHOT 3) shown in the lower part of FIG. 14 is used to generate the magnetic field correction map. In the third embodiment, the template shots 1 and 3 are used to generate the magnetic field correction map to correct the non-uniformity of the static magnetic field as in the first embodiment. To generate the magnetic field correction map, the timing of occurrence of the MR signal corresponding to the zero phase encode step desirably differs between the template shots 1 and 3.

Thus, the timing of occurrence of the MR signal corresponding to the zero phase encode step in the template shot 3 is delayed compared with the timing in the template shot 1 by the Gro inversion interval. The "delay" is relative to the time of start of application of the prepulse of the gradient magnetic field in the phase encoding direction Gpe, for example.

In the template shot 3, the area of the prepulse of the gradient magnetic field in the phase encoding direction Gpe (the absolute value of the time-integrated value of the intensity) is equal to the sum of the areas of the first five phase encode step pulses. That is, in the template shot 3, the temporally sixth acquired MR signal corresponds to the zero phase encode step, is placed on the center line of the k-space, and has the maximum intensity.

Now, the timing of occurrence of the MR signal corresponding to the zero phase encode step will be considered. This timing corresponds to the effective echo time (EFFECTIVE ECHO TIME) indicated by the vertical dashed line in FIG. 14 in the template shot 1. However, in the template shot 3, this timing is delayed compared with the timing in the template shot 1 by a time corresponding to one echo.

Accordingly, the polarity of the gradient magnetic field in the readout direction Gro at the timing of occurrence of the MR signal corresponding to the zero phase encode step is negative both in the template shots 1 and 3 (see FIG. 14). In the first embodiment, the template shot 2 is used to generate both the phase correction data and the magnetic field correction map, so that the polarity of the gradient magnetic field in the readout direction at this timing in the template shot 2 is opposite to the polarity in the template shot 1, since it is desired to generate the phase correction data.

However, the template shot 3 in the third embodiment is not used to generate the phase correction data. Considering only the generation of the magnetic field correction map, the polarities of the gradient magnetic field in the readout direction Gra at the timing of the zero phase encode step in the two template shots 1 and 3 do not have to be opposite to each other.

Figure 15:
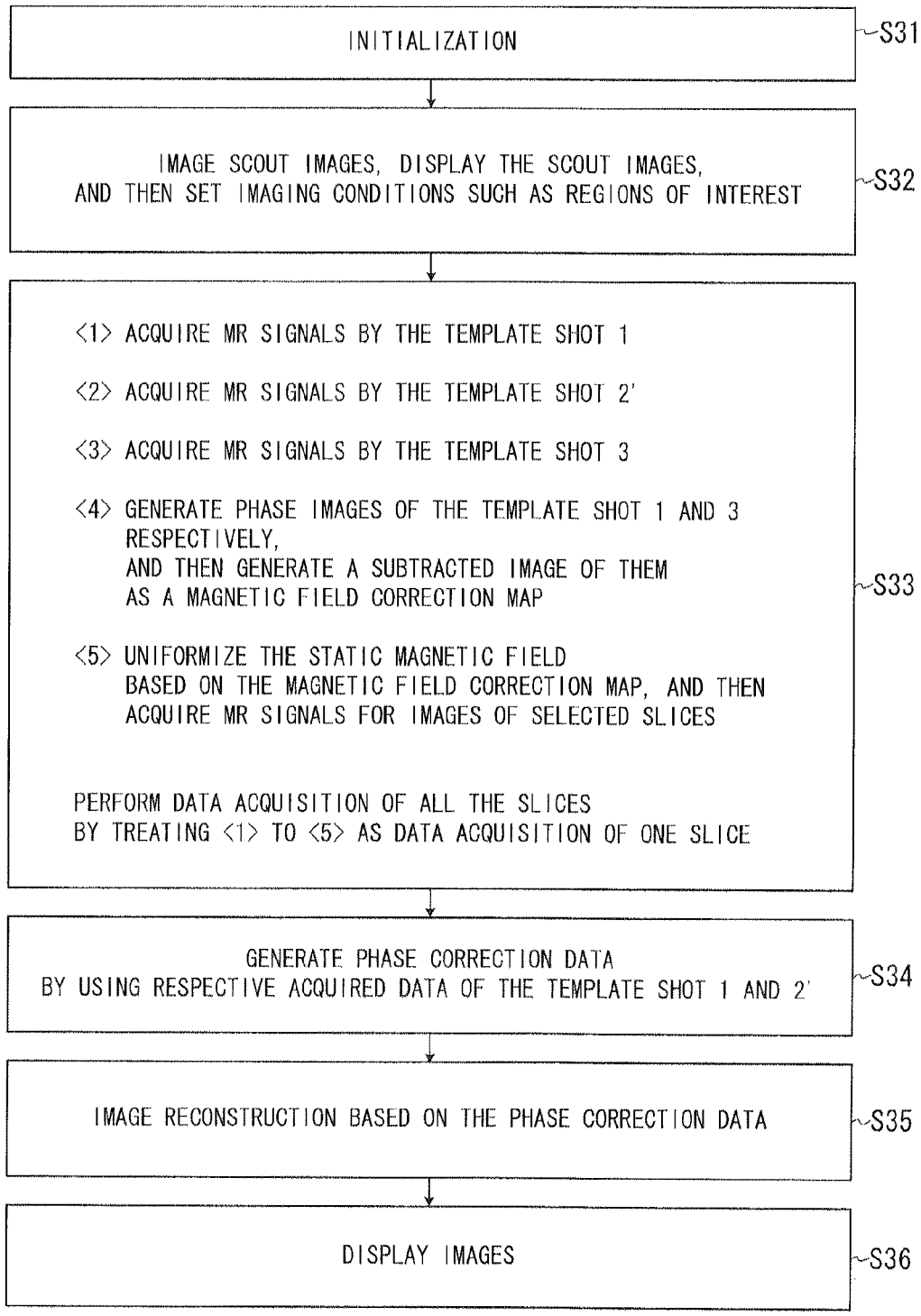
FIG. 15 is a flowchart illustrating a flow of a process performed by the MRI apparatus of the third embodiment.

FIG. 15 is a flow chart showing a flow of an operation of the MRI apparatus 20 according to the third embodiment. In the following, an operation of the MRI apparatus 20 according to the third embodiment will be described following the steps shown in FIG. 15.

[Step S31] As in Step S1 in the first embodiment, initial setting of the MRI apparatus 20 is performed.

[Step S32] As in Step S2 in the first embodiment, the image data on the scout image is generated, the display device 64 displays the scout image, and the imaging conditions including the region of interest are set.

[Step S33] The MRI apparatus 20 performs three kinds of template shots for generating the phase correction data and the magnetic field correction map as the prescan according to the flow <1> to <5> described below, and then performs the main scan. The template shots 1, 2' and 3 are performed for the spatially same region that is the same as the imaging region for the main scan.

<1> As in <1> of Step S3 in the first embodiment, the MRI apparatus 20 performs the pulse sequences for the template shot 1. As a result, the k-space data for the template shot 1 is placed (stored) in the k-space formed in the k-space database 92.

<2> As in <2> in step S23 in the second embodiment, the MRI apparatus 20 performs the pulse sequences for the template shot 2'. As a result, the k-space data for the template shot 2' is placed (stored) in the k-space formed in the k-space database 92.

<3> The MPU 86 sets the pulse sequences for the template shot 3 described above, inputs the pulse sequences to the sequence controller 56, and instructs to start data acquisition. As a result, the k-space data for the template shot 3 is placed in the k-space formed in the k-space database 92.

<4> The correction unit 100 acquires the k-space data for the template shots 1 and 3 from the k-space database 92 in the image reconstruction unit 90. The correction unit 100 generates the first phase image which is a phase image for the template shot 1, and the second phase image which is a phase image for the template shot 3.

Then, the correction unit 100 generates the subtracted image between the first phase image and the second phase image according to the formula (3) as described above, and inputs the subtracted image to the MPU 86 as the magnetic field correction map.

<5> As in <4> in Step 3 in the first embodiment, a correction to uniformize the static magnetic field is performed based on the magnetic field correction map, and then, acquisition of MR signals in the main scan is performed under the set imaging conditions.

The MRI apparatus 20 performs the data acquisition for all the slices, by treating the aforementioned processes <1> to <5> as the data acquisition for one slice.

[Step S34] The correction unit 100 calculates the phase correction data for all the slices by using the k-space data for the template shots 1 and 2' as in Step S4 in the first embodiment. Then, the correction unit 100 inputs each calculated phase correction data to the image reconstruction unit 90 in association with the slice for which the phase correction data is calculated.

[Step S35] As in Step S5 in the first embodiment, the image reconstruction unit 90 reconstructs the image data for each slice by correcting the phase error in the MR signals based on the phase correction data for the slice. Then, as in Step S5 in the first embodiment, the image data for display is generated and saved in the storage device 66.

[Step S36] As in Step S6 in the first embodiment, the image indicated by the image data for display is displayed. This is the end of the description of the operation of the MRI apparatus 20 according to the third embodiment.

As can be seen from the above description, the third embodiment provides the same advantages as the first embodiment.

[1] In the first to third embodiments, as shown in FIGS. 3, 12 and 14, the same pulse sequences are used in the main scan and the template shot 1 as an example. However, embodiments of the present invention are not limited to such an aspect. The pulse sequences for the main scan and the pulse sequences for the template shot 1 may slightly differ from each other.

However, the pulse sequences for the template shots 1, 2, 2' and 3 are desirably the same except for the timings of start of application of the phase encode step pulses and the gradient magnetic field in the readout direction Gro. This is because a change to these conditions may make it difficult to selectively extract the phase difference. This holds true for the following supplemental notes [2] and [3].

[2] In the case where acquisition of MR signals in the main scan is performed after the non-uniformity of the static magnetic field is corrected based on the magnetic field correction map, such as in the first and third embodiments, the template shots 1, 2, 2' and 3 are preferably performed before the main scan. This is because "the correction of non-uniformity of the static magnetic field based on the magnetic field correction map" cannot be performed, if the magnetic field correction map is not generated before the main scan. In this case, the template shots 1, 2, 2' and 3 can be performed in any order.

However, if the correction of the non-uniformity of the static magnetic field based on the magnetic field correction map is not performed in acquisition of the MR signals in the main scan, such as in the modification described below, the template shots (2, 2' or the like) can be performed after the main scan.

More specifically, in the first to the third embodiments, the phase error can be corrected based on data obtained from a group of echo signals (a group of MR signals) acquired by the main scan, without performing the template shot 1. In this case, the phase correction data is calculated according to the formula (1) by using the MR signals acquired by the main scan as the template data 1. Since the template shot 1 is omitted, the imaging time is reduced.

In the first and third embodiments described above, the main scan is performed after the static magnetic field is uniformized by using the shim coil 24 or the like based on the magnetic field correction map. However, modifications of the first and third embodiments, such as those described below, are possible. Specifically, in a modification of the first embodiment in which the template shot 1 is omitted, and the data obtained in the main scan is used, the following process can be performed instead of the uniformalization of the static magnetic field by using the shim coil 24 or the like, for example. That is, the group of MR signals acquired by the main scan is used as the template data 1, and the magnetic field correction map is generated based on the template data 1 and the template data 2 in Step S4 after the main scan. Then, a distortion amount can be calculated based on the magnetic field correction map, and thereby a distortion correction (pixel movement) on the image data reconstructed, by performing the phase correction of the MR signals can be performed.

A modification of the third embodiment in which the template shots 1 and 3 are omitted, and the data obtained by the main scan is used can be provided in the same way as the modification of the first embodiment described above.

[3] In the first to third embodiments, the spin-echo single-shot EPI has been described as an example. However, the principle of the embodiments described above can be applied to other types of EPI, such as a field-echo EPI, and is not limited to the single shot EPI but can be applied to the multi-shot EPI.

Figure 16:
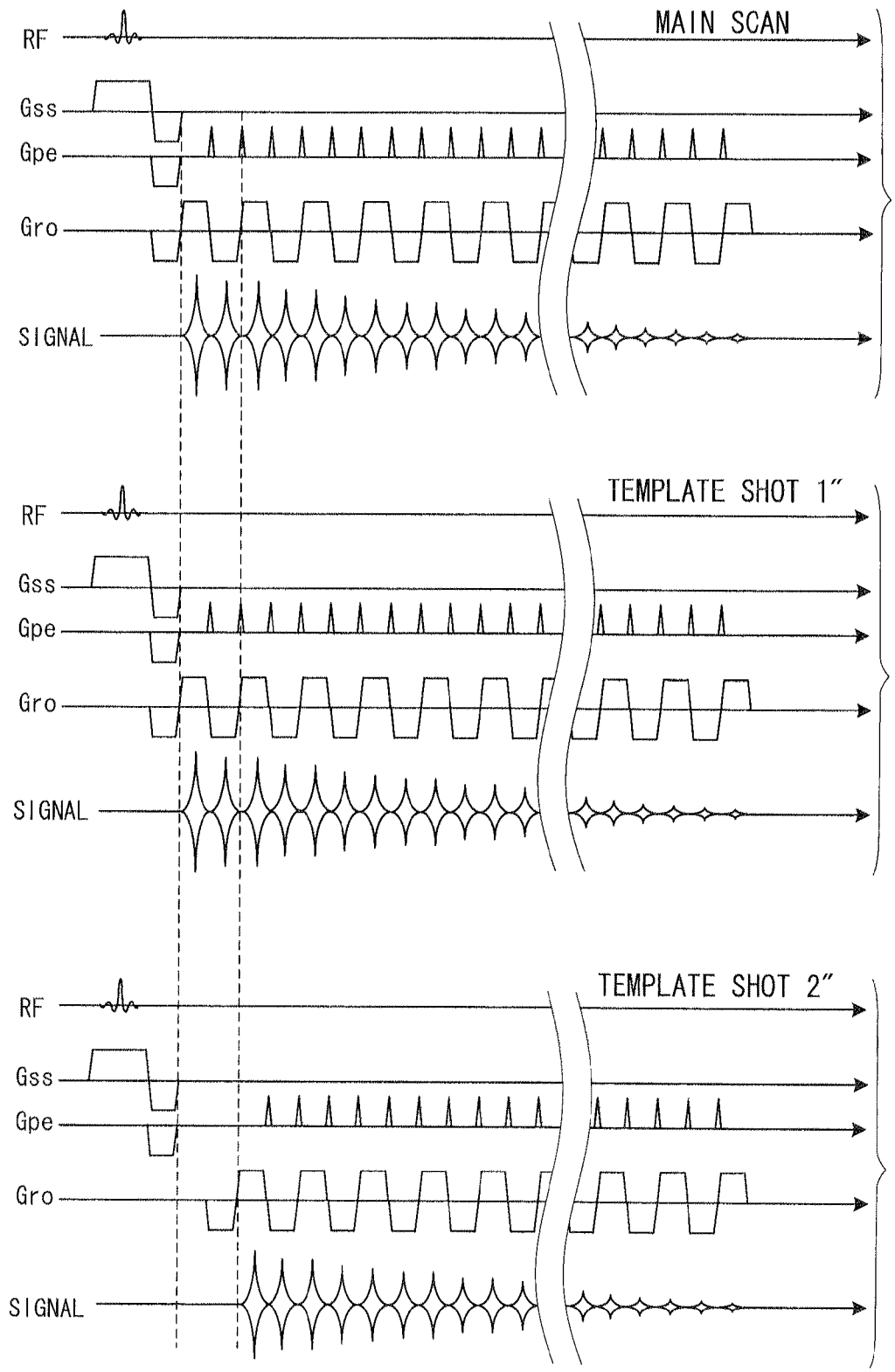
FIG. 16 is a timing chart showing an example of pulse sequences for a main scan and template shots 1" and 2" in a single shot EPI of the free induction decay (FID) type.

FIG. 16 is a timing chart similar to FIG. 3 showing an example of pulse sequences for a main scan and template shots 1" and 2" in a single shot EPI of the free induction decay (FID) type.

In FIG. 16, the upper part shows the pulse sequences for the main scan, the middle part shows the pulse sequences for the template shot 1", and the lower part shows the pulse sequences for the template shot 2". Although the timing of start of application of the gradient magnetic field in the readout direction Gro differs between the template shots 1" and 2" by twice the echo interval in FIG. 16, this is only an example, and the timing may differ by other natural number multiples of the echo interval.

[4] In the embodiments described above, a slice is set as the imaging region, and 2-dimensional image data is generated. However, embodiments of the present invention are not limited to such an aspect. The imaging region may be a slab. The image data generated may be image data for a 2-dimensional image or 3-dimensional volume data.

[5] An example has been described in which, as the MRI apparatus 20, the RF receiver 48 is disposed outside the gantry that includes the static magnetic field magnet 22, the shim coil 24, the gradient magnetic field coil unit 26, the RF coils 28 and the like (see FIG. 1). However, the embodiment of the present invention is not limited to such an implementation. The RF receiver 48 may be included in the gantry.

More specifically, for example, an electronic circuit board that is equivalent to the RF receiver 48 may be disposed in the gantry. Then, the MR signal, which is an analog electrical signal converted from the electromagnetic wave by the receiving RF coil, may be amplified by a pre-amplifier in the electronic circuit board, the amplified signal may be outputted to the outside of the gantry as a digital signal and inputted to the sequence controller 56. In outputting the signal to the outside of the gantry, for example, an optical communication cable is preferably used to transmit the signal in the form of an optical digital signal. This is because the effect of external noise is reduced.

[6] Correspondences between terms used in the claims and terms used in the embodiment described above will be described. Note that the correspondences described below are just some of possible interpretations for reference and should not be construed as limiting the present invention.

The functions of the entirety of the static magnetic field magnet 22, the shim coil 24, the gradient coil 26, the RF coils 28 and the control device 30 (see FIG. 1) that acquire MR signals in the main scan based on the EPI sequence are examples of the imaging data acquisition unit described in the claims.

The functions of the entirety of the static magnetic field magnet 22, the shim coil 24, the gradient coil 26, the RF coils 28 and the control device 30 that acquire MR signals by performing template shot 1 are examples of the first acquisition unit described in the claims.

In the case of calculating phase correction data under the equation (1) by treating MR signals in the main scan as the template data 1 without performing the template shot 1, the functions of the entirety of the static magnetic field magnet 22, the shim coil 24, the gradient coil 26, the RF coils 28 and the control device 30 that acquire MR signals in the main scan are examples of the first acquisition unit described in the claims.

The functions of the entirety of the static magnetic field magnet 22, the shim coil 24, the gradient coil 26, the RF coils 28 and the control device 30 that acquire MR signals by performing template shot 2 (or 2') are examples of the second acquisition unit described in the claims.

The functions of the entirety of the static magnetic field magnet 22, the shim coil 24, the gradient coil 26, the RF coils 28 and the control device 30 that acquire MR signals by performing template shot 3 are examples of the third acquisition unit described in the claims.

The function of the correction unit 100 that generates the phase correction data and the magnetic field correction map, the function of the image reconstruction unit 90 that performs correction of phase error based on the magnetic field correction map, and the functions of the entirety of the gradient magnetic field power supply 44, the gradient coil 26 and the control device 30 that perform magnetic field correction so as to uniformize the static magnetic field before the main scan based on the magnetic field correction map are examples of the correction unit described in the claims.

[6] While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A magnetic resonance imaging apparatus that performs EPI (echo planar imaging), the EPI including transmitting an excitation pulse to cause a nuclear magnetic resonance in an object in a static magnetic field, acquiring a plurality of echo signals generated by repeatedly inverting a polarity of a gradient magnetic field in a readout direction, and reconstructing image data on the object based on the plurality of echo signals, the magnetic resonance imaging apparatus comprising:

a first acquisition unit that acquires, as first template data, the plurality of echo signals generated by performing an EPI echo signal acquisition sequence including application of a gradient magnetic field in a phase encoding direction as a prescan;

a second acquisition unit that acquires, as second template data, the plurality of echo signals generated by performing an EPI echo signal acquisition sequence including application of a gradient magnetic field in the phase encoding direction after acquisition of the first template data as a prescan, so that start timing of application of the gradient magnetic field in the readout direction in acquisition of the second template data, is shifted from start timing of application of the gradient magnetic field in the readout direction in acquisition of the first template data;

an imaging data acquisition unit that acquires the plurality of echo signals from the object by performing an EPT echo signal sequence as a main scan; and a correction unit that performs at least correction of phase error in the echo signals by using the first template data and the second template data in reconstruction of the image data from the plurality of echo signals acquired in the main scan by the imaging data acquisition unit.

2. The magnetic resonance imaging apparatus according to claim 1, wherein:

the correction unit is configured to perform both the correction of the phase error and correction of the magnetic field to make the static magnetic field more uniform by using the first template data and the second template data.

3. The magnetic resonance imaging apparatus according to claim 2, wherein:

the imaging data acquisition unit is configured to acquire the plurality of echo signals by performing an EPI echo signal sequence after acquisition of the first template data and the second template data; and the correction unit is configured to perform the correction of magnetic field before acquisition of the plurality of echo signals by the imaging data acquisition unit.

4. The magnetic resonance imaging apparatus according to claim 3, wherein:

the first acquisition unit and the second acquisition unit are configured to perform the echo signal acquisition sequences respectively on a same region as an imaging region from which the imaging data acquisition unit is to acquire the plurality of echo signals, so as to acquire the first template data and the second template data from the same region.

5. The magnetic resonance imaging apparatus according to claim 4, wherein:

the second acquisition unit is configured to shift the start timing of application of the gradient magnetic field in the readout direction from the start timing of application of the gradient magnetic field in the readout direction in acquisition of the first template data by a length of time equal to a natural number multiple of a length of time required for the polarity of the gradient magnetic field in the readout direction to be inverted again after once inverted.

6. The magnetic resonance imaging apparatus according to claim 2, wherein:

the correction unit is configured to perform the correction of magnetic field to uniformize the static magnetic field and then perform the correction of the phase error.

7. The magnetic resonance imaging apparatus according to claim 2, wherein:

the second acquisition unit is configured to perform acquisition of the second template data, so that occurrence timing of an echo signal corresponding to a zero phase encode step is shifted from occurrence timing of an echo signal corresponding to a zero phase encode step in acquisition of the first template data by the first acquisition unit.

8. The magnetic resonance imaging apparatus according to claim 4, wherein:

the second acquisition unit is configured to perform acquisition of the second template data, so that the polarity of the gradient magnetic field in the readout direction at occurrence timing of an echo signal corresponding to a zero phase encode step is opposite to the polarity of the gradient magnetic field in the readout direction at occurrence timing of an echo signal corresponding to a zero phase encode step in acquisition of the first template data by the first acquisition unit.

9. The magnetic resonance imaging apparatus according to claim 8, wherein:

the correction unit is configured to calculate an arctangent of a value that is based on a ratio between a frequency-integrated value of data obtained by a 1-dimensional inverse Fourier transformation of a center line of imaginary part data of k-space data obtained from the first template data and a frequency-integrated value of data obtained by the 1-dimensional inverse Fourier transformation of a center line of real part data of the k-space data obtained from the first template data, calculate an arctangent of a value that is based on a ratio between a frequency-integrated value of data obtained by a 1-dimensional inverse Fourier transformation of a center line of imaginary part data of k-space data obtained from the second template data and a frequency-integrated value of data obtained by the 1-dimensional inverse Fourier transformation of a center line of real part data of the k-space data obtained from the second template data, and correct the phase error based on calculated arctangents.

10. The magnetic resonance imaging apparatus according to claim 9, wherein:

the second acquisition unit is configured to perform acquisition of the second template data, so that occurrence timing of the echo signal corresponding to the zero phase encode step is shifted from occurrence timing of the echo signal corresponding to the zero phase encode step in acquisition of the first template data by the first acquisition unit, and the correction unit is configured to generate a subtracted image between a phase image based on the first template data and a phase image based on the second template data as magnetic field correction map, and perform the correction of magnetic field based on the magnetic field correction map.

11. The magnetic resonance imaging apparatus according to claim 4, wherein:
the second acquisition unit is configured to perform acquisition of the second template data, so that occurrence timing of an echo signal corresponding to a zero phase encode step is shifted from occurrence timing of an echo signal corresponding to a zero phase encode step in acquisition of the first template data by the first acquisition unit.

12. The magnetic resonance imaging apparatus according to claim 11, wherein:
the correction unit is configured to generate a magnetic field correction map that corresponds to a phase difference between the first template data and the second template data, and perform the correction of magnetic field based on the magnetic field correction map.

13. The magnetic resonance imaging apparatus according to claim 12, wherein:
the correction unit is configured to generate a subtracted image between a phase image based on the first template data and a phase image based on the second template data as the magnetic field correction map.

14. The magnetic resonance imaging apparatus according to claim 1, wherein:
the second correction unit is configured to perform acquisition of the second template data, so that the polarity of the gradient magnetic field in the readout direction at occurrence timing of an echo signal corresponding to a zero phase encode step is opposite to the polarity of the gradient magnetic field in the readout direction at occurrence timing of an echo signal corresponding to a zero phase encode step in acquisition of the first template data by the first acquisition unit.

15. The magnetic resonance imaging apparatus according to claim 1, further comprising:
a third acquisition unit that acquires, as third template data, the plurality of echo signals generated by performing an echo signal acquisition sequence of the EPI including application of a gradient magnetic field in the phase encoding direction after acquisition of the second template data, so that start timing of application of the gradient magnetic field in the readout direction in acquisition of the third template data is shifted from start timing of application of the gradient magnetic field in the readout direction in acquisition of the first template data;
wherein the second acquisition unit is configured to perform acquisition of the second template data, so that the polarity of the gradient magnetic field in the readout direction at occurrence timing of an echo signal corresponding to a zero phase encode step is opposite to the polarity of the gradient magnetic field in the readout direction at occurrence timing of an echo signal corresponding to a zero phase encode step in acquisition of the first template data by the first acquisition unit;
the third acquisition unit is configured to perform acquisition of the third template data, so that occurrence timing of an echo signal corresponding to a zero phase encode step is shifted from occurrence timing of an echo signal corresponding to a zero phase encode step in acquisition of the first template data by the first acquisition unit; and the correction unit is configured to perform the correction of the phase error by using the first template data and the second template data, and perform correction of magnetic field to the static magnetic field by using the first template data, and the third template data.

16. The magnetic resonance imaging apparatus according to claim 15, further comprising:
an imaging data acquisition unit that acquires the plurality of echo signals from the object by performing an echo signal sequence of the EPI after acquisition of the first template data and third template data;
wherein the correction unit is configured to perform the correction of magnetic field before acquisition of the plurality of echo signals by the imaging data acquisition unit, and perform the correction of the phase error in reconstruction of the image data from the plurality of echo signals acquired by the imaging data acquisition unit.

17. The magnetic resonance imaging apparatus according to claim 16, wherein:
the first acquisition unit, the second acquisition unit and the third acquisition unit are configured to perform the echo signal acquisition sequences of the EPI respectively on a same region as an imaging region from which the imaging data acquisition unit is to acquire the plurality of echo signals, so as to acquire the first template data, the second template data and the third template data from the same region respectively; and
the correction unit is configured to perform the correction of magnetic field based on a subtracted image between a phase image based on the first template data and a phase image based on the third template data, calculate an arctangent of a value that is based on a ratio between a frequency-integrated value of data obtained by a 1-dimensional inverse Fourier transformation of a center line of imaginary part data of k-space data obtained from the first template data and a frequency-integrated value of data obtained by the 1-dimensional inverse Fourier transformation of a center line of real part data of the k-space data obtained from the first template data, calculate an arctangent of a value that is based on a ratio between a frequency-integrated value of data obtained by a 1-dimensional inverse Fourier transformation of a center line of imaginary part data of k-space data obtained from the second template data and a frequency-integrated value of data obtained by the 1-dimensional inverse Fourier transformation of a center line of real part data of the k-space data obtained from the second template data, and correct the phase error based on calculated arctangents, and, correct the phase error based on calculated arctangents.

18. A magnetic resonance imaging method including EPI (echo planar imaging), the EPI including transmitting an excitation pulse to cause a. nuclear magnetic resonance in an object in a static magnetic field, acquiring a plurality of echo signals generated by repeatedly inverting a polarity of a gradient magnetic field in a readout direction, and reconstructing image data on the object based on the plurality of echo signals, the magnetic resonance imaging method comprising:
acquiring, as first template data, the plurality of echo signals generated by performing an echo signal acquisition sequence including application of a gradient magnetic field in a phase encoding direction as a prescan;
acquiring, as second template data, the plurality of echo signals generated by performing an EPI echo signal acquisition sequence including application of a gradient magnetic field in the phase encoding direction after acquisition of the first template data, so that start timing of application of the gradient magnetic field in the readout direction in acquisition of the second template data is shifted from start timing of application of the gradient magnetic field in the readout direction in acquisition of the first template data as a prescan;

acquiring the plurality of echo signals by performing an EPI echo sequence as a main scan; and performing at least correction of phase error in the echo signals by using the first template data and the second template data in reconstruction of the image data from the plurality of echo signals acquire in the main scan.

\* \* \* \* \*